US011158375B2

(12) United States Patent
Niki

(10) Patent No.: US 11,158,375 B2
(45) Date of Patent: Oct. 26, 2021

(54) SEMICONDUCTOR STORAGE DEVICE

(71) Applicant: Kioxia Corporation, Minato-ku (JP)

(72) Inventor: Yusuke Niki, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 88 days.

(21) Appl. No.: 16/782,114

(22) Filed: Feb. 5, 2020

(65) Prior Publication Data

US 2021/0082507 A1 Mar. 18, 2021

(30) Foreign Application Priority Data

Sep. 12, 2019 (JP) .............................. JP2019-166333

(51) Int. Cl.
| | |
|---|---|
| *G11C 7/14* | (2006.01) |
| *G11C 16/04* | (2006.01) |
| *G11C 16/08* | (2006.01) |
| *H01L 27/11556* | (2017.01) |
| *H01L 27/11582* | (2017.01) |
| *G11C 8/10* | (2006.01) |
| *G11C 16/26* | (2006.01) |

(52) U.S. Cl.
CPC ................ *G11C 16/08* (2013.01); *G11C 8/10* (2013.01); *G11C 16/26* (2013.01); *H01L 27/11556* (2013.01); *H01L 27/11582* (2013.01)

(58) Field of Classification Search
CPC ... G11C 11/4097; G11C 11/4091; G11C 7/12; G11C 7/18; G11C 7/1069; G11C 7/08; G11C 5/06; G11C 7/1051; G11C 16/08; G11C 29/1201; G11C 7/14; G11C 11/4085; G11C 11/4087; G11C 13/0023; G11C 16/10; G11C 16/04
See application file for complete search history.

(56) References Cited

U.S. PATENT DOCUMENTS

| | | | | |
|---|---|---|---|---|
| 9,208,830 | B2 * | 12/2015 | Niki ...................... | G11C 11/413 |
| 2013/0343141 | A1 * | 12/2013 | Tanaka .................... | G11C 7/14 |
| | | | | 365/210.13 |
| 2016/0141039 | A1 | 5/2016 | Arakawa | |
| 2018/0151200 | A1 * | 5/2018 | Miyazaki ............... | G11C 5/063 |

* cited by examiner

*Primary Examiner* — Hien N Nguyen
(74) *Attorney, Agent, or Firm* — Oblon, McClelland, Maier & Neustadt, L.L.P.

(57) ABSTRACT

A semiconductor storage device includes first signal lines divided into groups respectively including m (m is an integer equal to or larger than 2) of the first signal lines; and second signal lines. A memory cell array includes memory cells provided to correspond to respective intersections of the first signal lines and the second signal lines. A selection voltage is applied to any of the first signal lines through m global signal lines. First transistors are provided to respectively correspond to the first signal lines and connected between the first signal lines and the global signal lines. First selection signal lines are provided to respectively correspond to the groups and connected to gate electrodes of the first transistors included in a corresponding one of the groups in common. First dummy signal lines are arranged between adjacent ones of the groups, to which a non-selection voltage is applied.

19 Claims, 14 Drawing Sheets

MUX

SEMICONDUCTOR STORAGE DEVICE

CROSS REFERENCE TO RELATED APPLICATIONS

This application is based upon and claims the benefit of priority from the prior Japanese Patent Application No. 2019-166333, filed on Sep. 12, 2019, the entire contents of which are incorporated herein by reference.

FIELD

The embodiments of the present invention relate to a semiconductor storage device.

BACKGROUND

In recent years, the number of bit lines or word lines is significantly increasing along with increase of the capacity of a semiconductor storage device. The increase of the number of bit lines or word lines causes increase of the area occupied by a decoder for selecting the bit lines or the word lines. Therefore, it is required to reduce the area occupied by a multiplexer for selecting the bit lines or the word lines in the decoder.

Meanwhile, when transistors of the multiplexer are omitted to reduce the occupied area, there is a risk that a selection voltage is wrongly applied to an unselected bit line or an unselected word line, or the selection voltage affects the voltage of an unselected bit line or an unselected word line adjacent to a selected bit line or a selected word line, for example.

DETAILED DESCRIPTION

Figure 1:
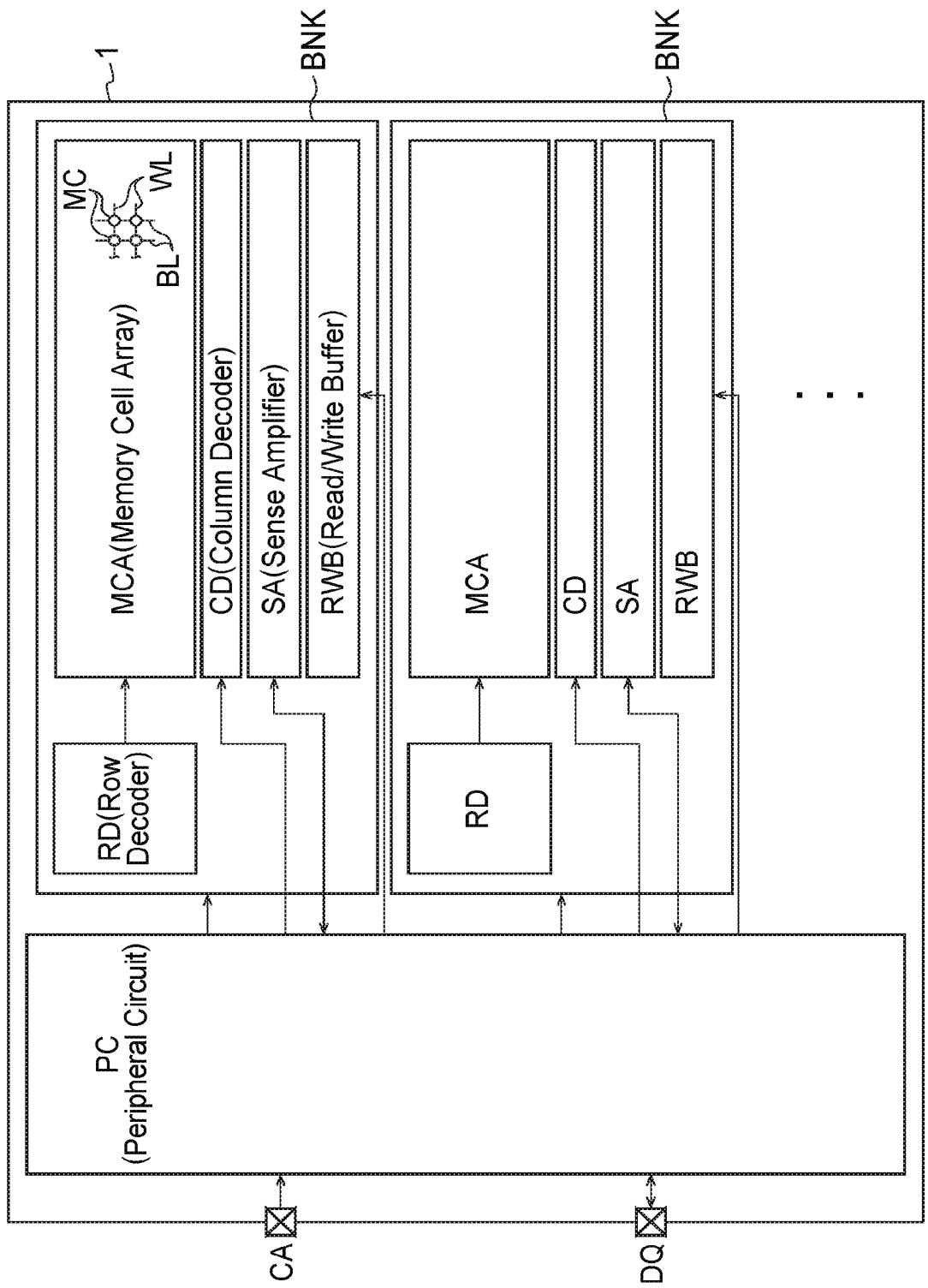
FIG. 1 is a block diagram illustrating a configuration example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by similar reference characters and detailed explanations thereof are omitted as appropriate.

A semiconductor storage device according to the present embodiment comprises: a plurality of first signal lines divided into a plurality of groups respectively including m (m is an integer equal to or larger than 2) of the first signal lines; and a plurality of second signal lines. A memory cell array includes a plurality of memory cells provided to correspond to respective intersections of the first signal lines and the second signal lines. A selection voltage is applied to any of the first signal lines through m global signal lines. A plurality of first transistors are provided to respectively correspond to the first signal lines and connected between the first signal lines and the global signal lines. A plurality of first selection signal lines are provided to respectively correspond to the groups and connected to gate electrodes of the first transistors included in a corresponding one of the groups in common. A plurality of first dummy signal lines are arranged between adjacent ones of the groups, to which a non-selection voltage is applied.

First Embodiment

FIG. 1 is a block diagram illustrating a configuration example of a semiconductor storage device according to a first embodiment. A semiconductor storage device 1 may be, for example, a volatile memory such as a DRAM or a non-volatile memory such as a NAND EEPROM (Electrically Erasable and Programmable Read-Only-Memory), a ReRAM, a MRAM, and a PCM. Moreover, the semiconductor storage device 1 may be, for example, a single memory chip or a module including a plurality of memory chips, such as a DIMM (Dual Inline Memory Module).

The semiconductor storage device 1 illustrated in FIG. 1 is configured as a single memory chip, for example. Hereinafter, the semiconductor storage device 1 is referred to as "memory chip 1". The memory chip 1 includes a memory cell array MCA, a column decoder CD, a row decoder RD, a sense amplifier SA, a read/write buffer RWB, and a peripheral circuit PC.

The memory cell array MCA includes a plurality of memory cells MC two-dimensionally arranged in a matrix, for example. The memory cells MC are PCMs, for example. The memory cells MC are arranged to correspond to respective intersections of bit lines BL and word lines WL, for example. That is, the memory cell array MCA is a so-called cross-point memory cell array. The bit lines BL intersect with the word lines WL substantially at a right angle, when viewed from above a semiconductor substrate. The bit lines BL are each connected to one ends of the memory cells MC of the memory cell array MCA. The word lines WL each function as gate electrodes of the memory cells MC of the memory cell array MCA in some cases. The memory cell array MCA is divided into a plurality of banks BNK within one chip. In each bank BNK, the sense amplifier SA, a data latch DL, and an address latch AL are provided, for example.

The sense amplifier SA is connected to the memory cells MC via the column decoder CD and the bit lines BL, for example, and applies a write voltage (for example, VDD or VSS) or a read voltage to the memory cells MC via the bit lines BL. The sense amplifier SA applies the write voltage to a memory cell MC to write data into that memory cell MC, or applies the read voltage to a memory cell MC to read data from that memory cell MC.

The read/write buffer RWB temporarily retains data detected by the sense amplifier SA and an address for each page or temporarily retains data to be written into the memory cell array MCA and an address for each page.

The row decoder RD and the column decoder CD access the memory cell array MCA based on a bank address and a page address and apply the write voltage or the read voltage to the word line WL and the bit line BL. The row decoder RD applies the write voltage or the read voltage to a selected word line selected from the word lines WL. The column decoder CD connects a selected bit line selected from the bit lines BL to the sense amplifier SA. The sense amplifier SA applies the write voltage or the read voltage to the selected bit line. Accordingly, the memory chip 1 can write data into a desired memory cell MC in the memory cell array MCA or read data from the desired memory cell MC.

Although not illustrated, the peripheral circuit PC includes a voltage generator, a read/write engine, an address controller, a command controller, and an input/output circuit, for example.

The voltage generator generates a voltage for the word lines WL and a voltage for the bit lines BL required for a data read operation and a data write operation.

The read/write engine controls the column decoder CD and the row decoder RD to write data into a desired memory cell MC in the bank BNK or read data from the desired memory cell MC in the bank BNK in accordance with a command and an address. The read/write engine transfers the read data to a DQ buffer in the input/output circuit.

The address controller receives a row address and a column address, for example, and decodes these addresses. The command controller receives commands indicating various types of operations including a data read operation and a data write operation and transfers those commands to the read/write engine.

The input/output circuit (JO) takes in a command and an address from a CA terminal CA and transfers the command to the command controller and the address to the address controller. The command may be a write command that instructs a write operation or a read command that instructs a read operation. The address may be a bank address indicating any of the banks BNK in the memory cell array MCA and an address indicating a page or a memory cell MC in the bank BNK for which reading or writing is to be performed. In a case where a plurality of the banks BNK form one bank group, the address may be an address of a bank group.

The input/output circuit takes in write data from a DQ terminal and transfers the write data to the read/write buffer RWB, or receives read data retained in the data latch DL and outputs the read data via the DQ terminal.

A memory controller (not illustrated) that controls all the memory chips 1 can be provided outside the memory chip 1.

Figure 2:
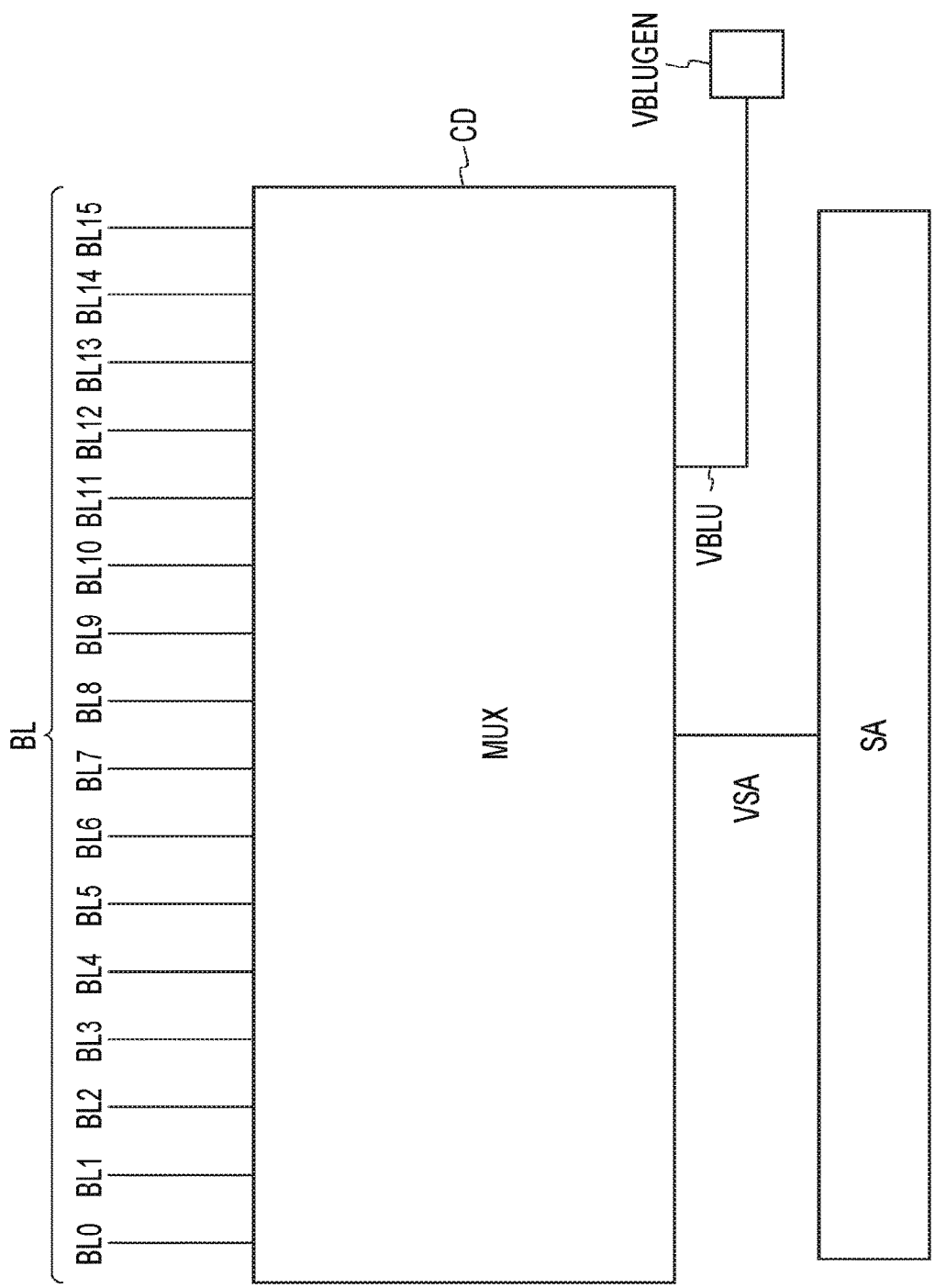
FIG. 2 is a block diagram illustrating a configuration example of the column decoder, the sense amplifier, and the bit lines.

FIG. 2 is a block diagram illustrating a configuration example of the column decoder CD, the sense amplifier SA, and the bit lines BL. The column decoder CD includes a multiplexer MUX.

The multiplexer MUX is provided between the bit lines BL and the sense amplifier SA. The multiplexer MUX is configured to be able to receive a selection voltage VSA and a non-selection voltage VBLU and apply either one of them to each bit line BL. The internal configuration of the multiplexer MUX will be described later.

The sense amplifier SA applies a write voltage (for example, VDD or VSS) and a read voltage to a selected memory cell MC as the selection voltage VSA, for example.

A non-selection voltage generator VBLUGEN generates the non-selection voltage VBLU to be applied to an unselected memory cell MC that is not selected. The non-selection voltage generator VBLUGEN may be incorporated in the peripheral circuit PC or be provided outside the memory chip 1.

Figure 3:
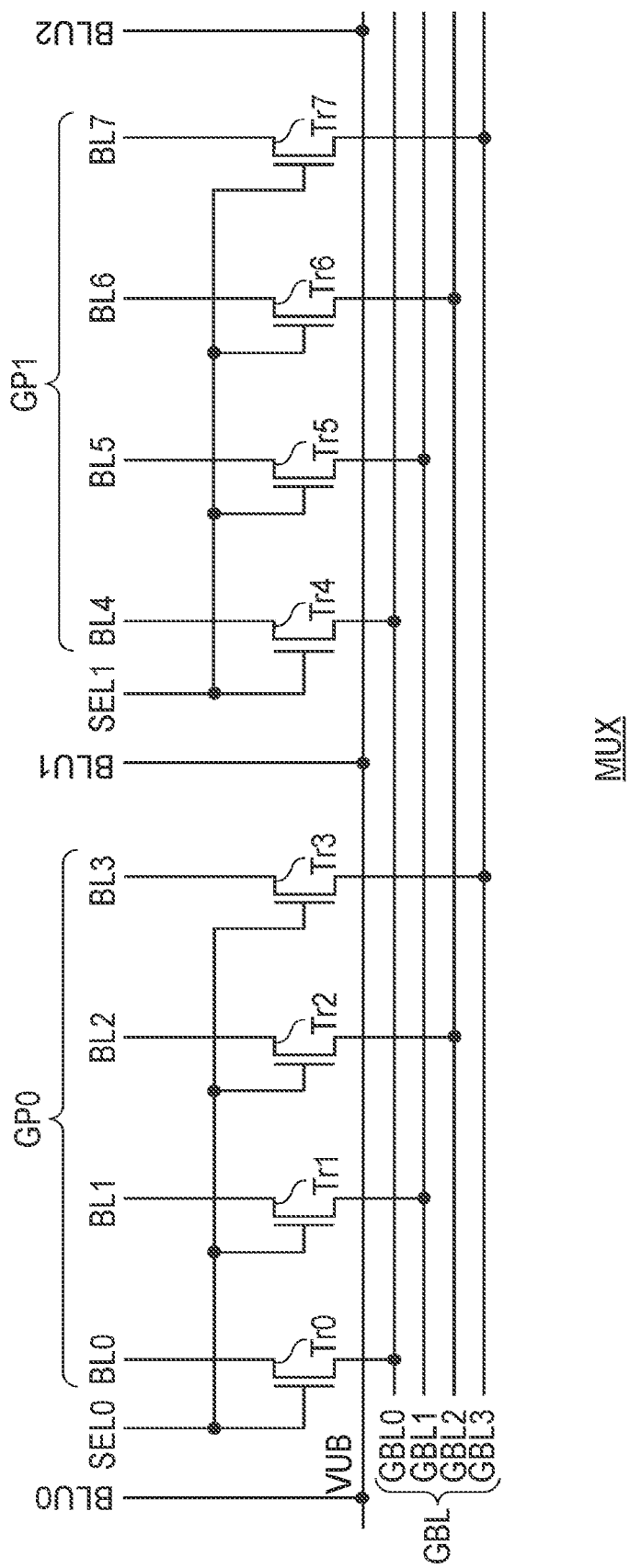
FIG. 3 is a circuit diagram illustrating a configuration example of the multiplexer in the column decoder according to the first embodiment.

FIG. 3 is a circuit diagram illustrating a configuration example of the multiplexer MUX in the column decoder CD according to the first embodiment. In the following descriptions, the multiplexer MUX is provided in the column decoder CD that selectively drives the bit lines BL as first signal lines. In this case, second signal lines are the word lines WL. However, the multiplexer MUX may be provided in the row decoder RD that selectively drives the word lines WL. In this case, the second signal lines are the bit lines BL. Moreover, the multiplexer MUX may be provided in both the column decoder CD and the row decoder RD.

The bit lines BL as the first signal lines are divided into a plurality of groups each including m (m is an integer equal to or larger than 2) bit lines BL. In the present embodiment, for example, eight bit lines BL are divided into two groups GP0 and GP1 each including four bit lines BL. That is, m=4 is realized in the present embodiment. Division of the bit lines BL means conceptual division with regard to an operation in which a voltage is applied to the bit lines BL. The total number of the bit lines BL, the number of the groups, and the number of the bit lines BL included in each group are not specifically limited.

Global bit lines GBL0 to GBL3 as global signal lines are provided for all the bit lines BL (all the groups GP0 and GP1) in common. The number of the global bit lines GBL0 to GBL3 is the same as the number of the bit lines BL included in each group (that is, m). For example, in the present embodiment, four bit lines BL are included in each of the groups GP0 and GP1, and four global bit lines GBL0 to GBL3 are provided to correspond to the groups GP0 and GP1. The groups GP0 and GP1 are mutually different groups of bit lines connected to the global bit lines GBL0 to GBL3. Therefore, the number of the global bit lines GBL0 to GBL3 (j in Expression 1 described later) is equal to or larger than the number of bit lines included in each group (m in Expression 1 described later).

Four bit lines BL0 to BL3 or BL4 to BL7 in each group GP0 or GP1 are respectively connected to the global bit lines GBL0 to GBL3 via transistors Tr0 to Tr3 or Tr4 to Tr7. The bit lines BL0 to BL3 in the group GP0 are connected to the global bit lines GBL0 to GBL3 via the transistors Tr0 to Tr3, respectively. The bit lines BL4 to BL7 in the group GP1 are connected to the global bit lines GBL0 to GBL3 via the transistors Tr4 to Tr7, respectively. That is, the bit lines BL0 and BL4 are connected to the global bit line GBL0 in common, the bit lines BL1 and BL5 are connected to the global bit line GBL1 in common, the bit lines BL2 and BL6 are connected to the global bit line GBL2 in common, and the bit lines BL3 and BL7 are connected to the global bit line GBL3 in common. One of the global bit lines GBL0 to GBL3 transmits the selection voltage VSA and the other three are kept to have the non-selection voltage VBLU or are electrically floating. The non-selection voltage VBLU is applied to a global bit line connected to an unselected bit line (an adjacent bit line) adjacent to a selected bit line. A global bit line connected to an unselected bit line not adjacent to the selected bit line may be electrically floating.

The transistors Tr0 to Tr7 as first transistors are provided to correspond to the bit lines BL0 to BL7, respectively, and are connected between the bit lines BL0 to BL7 and the global bit lines GBL0 to GBL3. The transistors Tr0 to Tr7 are each configured by an n-MOSFET (Metal Oxide Semiconductor Field Effect Transistor), for example. However, the transistors Tr0 to Tr7 may be configured by p-MOSFETs. Moreover, a device other than a transistor can be used as long as it has a switching function capable of switching connection.

Selection signal lines SEL0 and SEL1 as first selection signal lines are provided to correspond to the groups GP0 and GP1, respectively, and are each connected to gate electrodes of the transistors Tr0 to Tr3 or Tr4 to Tr7 in the corresponding group GP0 or GP1 in common. For example, the selection signal line SEL0 is connected to the gate electrodes of the transistors Tr0 to Tr3 in the group GP0 in common. The selection signal line SEL1 is connected to the gate electrodes of the transistors Tr4 to Tr7 in the group GP1 in common. Accordingly, the transistors Tr0 to Tr7 are driven for each of the groups GP0 and GP1. The voltage of each of the selection signal lines SEL0 and SEL1 is raised or is caused to fall by the peripheral circuit PC.

For example, it is assumed that the transistors Tr0 to Tr7 are n-MOSFETs. In this case, when the group GP0 is selected, the peripheral circuit PC raises the selection signal line SEL0 to turn ON the transistors Tr0 to Tr3 corresponding to the group GP0. Accordingly, the bit lines BL0 to BL3 in the group GP0 are connected to the global bit lines GBL0 to GBL3, respectively. That is, when a selected group is GP0, the transistors Tr0 to Tr3 electrically connect the four bit lines BL0 to BL3 included in the selected group GP0 and the four global bit lines GBL0 to GBL3 to each other, respectively. Meanwhile, when the group GP1 is selected, the peripheral circuit PC raises the selection signal line SEL1 to turn ON the transistors Tr4 to Tr7 corresponding to the group GP1. Accordingly, the bit lines BL4 to BL7 included in the group GP1 are connected to the global bit lines GBL0 to GBL3, respectively. That is, when the selected group is GP1, the transistors Tr4 to Tr7 electrically connect the four bit lines BL4 to BL7 included in the selected group GP1 and the four global bit lines GBL0 to GBL3 to each other, respectively.

As described above, one of the global bit lines GBL0 to GBL3 has the selection voltage VSA and the other three global bit lines are kept to have the non-selection voltage VBLU or are electrically floating. Therefore, the selection voltage VSA is applied to only one of four bit lines included in the selected group, and the non-selection voltage VBLU is applied to the other three bit lines or the other three global lines are electrically floating. The non-selection voltage VBLU is applied to a global bit line connected to an unselected bit line (an adjacent bit line) adjacent to a selected bit line. A global bit line connected to an unselected bit line not adjacent to the selected bit line may be electrically floating.

The selection signal line SEL1 (or SEL0) corresponding to an unselected group remains at a low level, and the four transistors Tr4 to Tr7 (or Tr0 to Tr3) are kept OFF. Therefore, the bit lines BL4 to BL7 (or BL0 to BL3) in the unselected group are electrically floating.

Dummy bit lines BLU1 as first dummy signal lines are arranged between the groups GP0 and GP1 that are adjacent to each other. The dummy bit lines BLU0 to BLU2 extend along the bit lines BL0 to BL7 to have the same length as the bit lines BL0 to BL7 or a longer length. For example, the dummy bit line BLU1 is arranged between the bit lines BL3 and BL4 along these lines Accordingly, the bit lines BL3 and BL4 are not adjacent to each other and are arranged via the dummy bit line BLU1. Arrangement of the dummy bit lines BLU0 and BLU2 are identical to that of the dummy bit line BLU1. The dummy bit line BLU0 is arranged between the group GP0 and a left group (not illustrated) adjacent to the group GP0, and the dummy bit line BLU2 is arranged between the group GP1 and a right group (not illustrated) adjacent to the group GP1.

All the dummy bit lines BLU0 to BLU2 are connected to a non-selection signal line VUB that supplies the non-selection voltage VBLU in common and are kept to have the non-selection voltage VBLU. In this manner, the dummy bit lines BLU0 to BLU2 that are kept to have the non-selection voltage VBLU are arranged on both sides of each of the groups GP0 and GP1.

Figure 4:
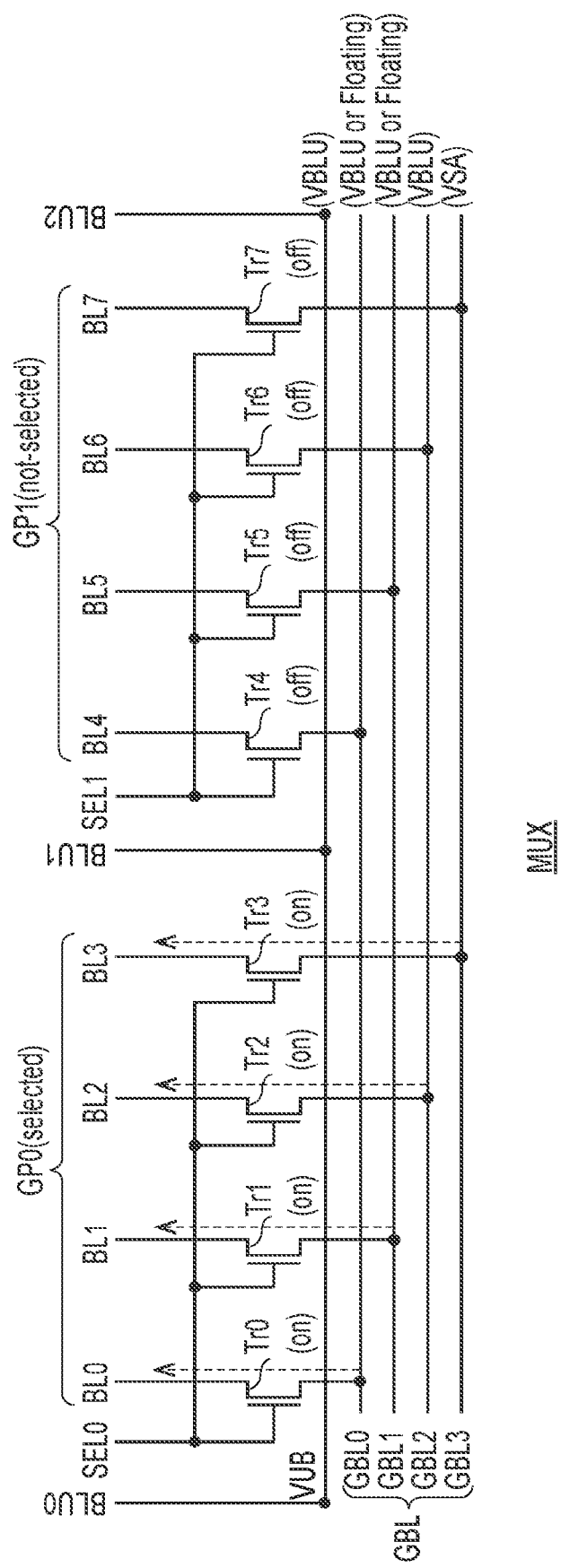
FIG. 4 is a diagram illustrating a state in a case of selecting the group.

FIG. 4 is a diagram illustrating a state in a case of selecting the group GP0. In a case where a selected group is GP0 and a selected bit line is BL3 as illustrated in FIG. 4, for example, the global bit lines GBL0 to GBL2 transmit the non-selection voltage VBLU and the global bit line GBL3 transmits the selection voltage VSA. The global bit lines GBL0 and GBL1 may be electrically floating. Moreover, the transistors Tr0 to Tr3 in the selected group GP0 are turned ON. Accordingly, the selection voltage VSA is transmitted to the selected bit line BL3 in the selected group GP0, and the non-selection voltage VBLU is transmitted to the unselected bit lines BL0 to BL2 in the selected group GP0. The unselected bit lines BL0 and BL1 connected to the global bit lines GBL0 and GBL1 may be electrically floating. Meanwhile, because the transistors Tr4 to Tr7 in the unselected group GP1 are kept OFF, the bit lines BL4 to BL7 in the unselected group GP1 are electrically floating.

If the dummy bit line BLU1 is not provided between the bit lines BL3 and BL4, the unselected bit line BL4 that is floating is directly adjacent to the selected bit line BL3. Therefore, the voltage of the unselected bit line BL4 is unstable and is likely to be affected by the selection voltage VSA when the voltage of the selected bit line BL3 is changed to the selection voltage VSA. When the voltage of the unselected bit line BL4 fluctuates, the memory cells MC connected to the bit line BL4 may be adversely affected. Moreover, heat generated in the memory cells MC connected to the selected bit line BL3 can be easily transferred to the memory cells MC connected to the unselected bit line BL4.

Meanwhile, in the semiconductor storage device according to the present embodiment, the dummy bit line BLU1 kept to have the non-selection voltage VBLU is arranged between the bit lines BL3 and BL4. The unselected bit line BL4 that is floating is not directly adjacent to the selected bit line BL3 but is arranged via the dummy bit line BLU1. That is, the unselected bit line BL4 is not adjacent to the selected bit line BL3 but is adjacent to the dummy bit line BLU1. Accordingly, capacity coupling between the bit lines BL3 and BL4 is suppressed, and the selection voltage VSA of the selected bit line BL3 does not affect the unselected bit line BL4 so much. As a result, although the unselected bit line BL4 is electrically floating, the voltage thereof does not fluctuate so much and becomes stable. Moreover, heat generated in the memory cells MC connected to the selected bit line BL3 hardly propagates to the memory cells MC connected to the unselected bit line BL4.

On the other hand, although not illustrated, in a case where the selected group is GP1 and the selected bit line is BL4, the global bit lines GBL1 to GBL3 transmit the non-selection voltage VBLU and the global bit line GBL0 transmits the selection voltage VSA. In this case, the global bit lines GBL2 and GBL3 may be electrically floating. Moreover, the transistors Tr4 to Tr7 in the selected group GP1 are turned ON. Accordingly, the selection voltage VSA is transmitted to the selected bit line BL4 in the selected group GP1, and the non-selection voltage VBLU is transmitted to the other unselected bit lines BL5 to BL7 in the selected group GP1. The unselected bit lines BL6 and BL7 connected to the global bit lines GBL2 and GBL3 may be electrically floating. Meanwhile, because the transistors Tr0 to Tr3 in the unselected group GP0 are kept OFF, the bit lines BL0 to BL3 in the unselected group GP0 are electrically floating. Also in this case, because the dummy bit line BLU1 kept to have the non-selection voltage VBLU is arranged between the bit lines BL3 and BL4, capacity coupling between the bit lines BL3 and BL4 is suppressed, and the selection voltage VSA of the selected bit line BL4 does not affect the unselected bit line BL3 that is floating so much. Moreover, heat generated in the memory cells MC connected to the selected bit line BL4 hardly propagates to the memory cells MC connected to the unselected bit line BL3.

The dummy bit lines BLU0 and BLU2 also function in an identical manner to that of the dummy bit line BLU1. Therefore, the dummy bit line BLU0 can suppress capacity coupling between the group GP0 and a left adjacent group thereof (not illustrated) or influence of heat. Moreover, the dummy bit line BLU2 can suppress capacity coupling between the group GP1 and a right adjacent group thereof (not illustrated) or influence of heat.

According to the present embodiment, the transistors Tr0 to Tr7 are provided to respectively correspond to the bit lines BL0 to BL7, and no additional transistor is provided. Therefore, it is possible to reduce an arrangement area. Moreover, it is possible to suppress voltage fluctuation on an unselected bit line BL by arranging the dummy bit lines BLU0 to BLU2 between groups of the bit lines BL.

The configurations and the functions described above can be applied not only to the column decoder CD but also to the row decoder RD. In a case of applying them to the row decoder RD, it suffices that "bit line" is replaced with "word line" and/or "word line" is added in addition to "bit line". For example, in the above configurations, a dummy bit line as the first dummy signal line is provided to be adjacent to a selected group including a plurality of bit lines as the first signal lines. However, a dummy word line as a second dummy signal line may be provided to be adjacent to a selected group including a plurality of word lines as second signal lines.

Second Embodiment

Figure 5:
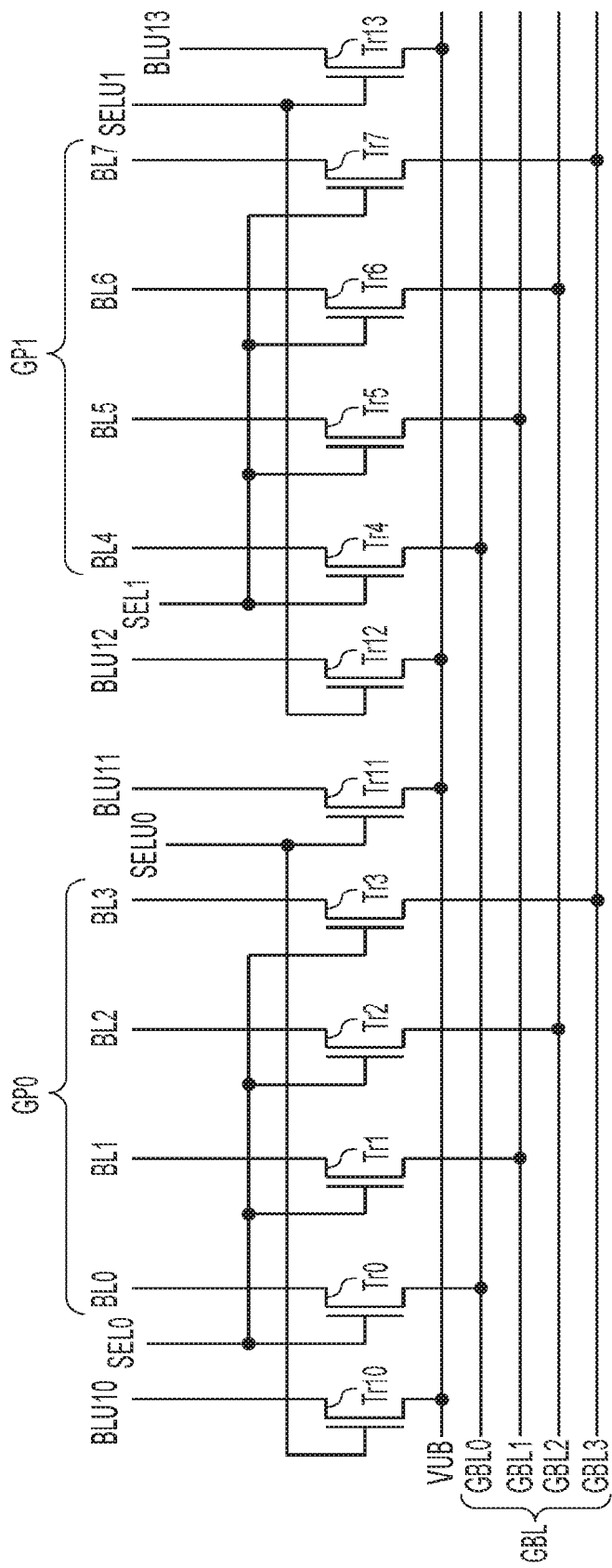
FIG. 5 is a circuit diagram illustrating a configuration example of the multiplexer in the column decoder according to a second embodiment.

FIG. 5 is a circuit diagram illustrating a configuration example of the multiplexer MUX in the column decoder CD according to a second embodiment. In the second embodiment, dummy bit lines are provided on both sides of each of the groups GP0 and GP1, so that each of the groups GP0 and GP1 is sandwiched between two dummy bit lines. For example, dummy bit lines BLU10 and BLU11 are provided on both sides of the group GP0, so that the group GP0 is sandwiched between the dummy bit lines BLU10 and BLU11. Dummy bit lines BLU12 and BLU13 are provided on both sides of the group GP1, so that the group GP1 is sandwiched between the dummy bit lines BLU12 and BLU13.

The dummy bit lines BLU10 to BLU13 extend along the bit lines BL0 to BL7 to have the same length as the bit lines BL0 to BL7 or a longer length, similarly to the dummy bit lines BLU0 to BLU2 in the first embodiment.

Transistors Tr10 to Tr13 as second transistors are connected between the dummy bit lines BLU10 to BLU13 and the non-selection signal line VUB, respectively. The transistors Tr10 to Tr13 are provided to respectively correspond to the dummy bit lines BLU10 to BLU13 and selectively connect the dummy bit lines BLU10 to BLU13 to the non-selection signal line VUB. The transistors Tr10 to Tr13 are configured by n-MOSFETs, for example. However, the transistors Tr10 to Tr13 may be configured by p-MOSFETs. Moreover, a device other than a transistor can be used as long as it has a switching function capable of switching connection.

Gate electrodes of the transistors Tr10 and Tr11 are connected to a dummy selection signal line SELU0 in common, and gate electrodes of the transistors Tr12 and Tr13 are connected to a dummy selection signal line SELU1 in common. The dummy selection signal lines SELU0 and SELU1 as second selection signal lines are provided to correspond to the groups GP0 and GP1, respectively. The dummy selection signal line c0 is connected to the gate electrodes of the transistors Tr10 and Tr11 in the group GP0 corresponding thereto in common. The dummy selection signal line SELU1 is connected to the gate electrodes of the transistors Tr12 and Tr13 in the group GP1 corresponding thereto in common.

The dummy selection signal line SELU0 may transmit the same signal as that of the selection signal line SEL0 and may be raised together with the selection signal line SEL0 when the group GP0 is selected. At this time, the transistors Tr0 to Tr3 are turned ON, and the transistors Tr10 and Tr11 are also turned ON simultaneously. When the transistors Tr10 and Tr11 are turned ON, the dummy bit lines BLU10 and BLU11 are connected to the non-selection signal line VUB to have the non-selection voltage VBLU. Accordingly, even if the bit line BL0 at one end of the selected group GP0 or the bit line BL3 at the other end is selected, the voltage of a bit line in a group adjacent to the selected bit line is hardly affected by the selection voltage VSA of the selected bit line BL0 or BL3.

The dummy selection signal line SELU1 may transmit the same signal as that of the selection signal line SEL1 and may be raised together with the selection signal line SEL1 when the group GP1 is selected. At this time, the transistors Tr4 to Tr7 are turned ON, and the transistors Tr12 and Tr13 are also turned ON simultaneously. When the transistors Tr12 and Tr13 are turned ON, the dummy bit lines BLU12 and BLU13 are connected to the non-selection signal line VUB to have the non-selection voltage VBLU. Accordingly, even if the bit line BL4 at one end of the selected group GP1 or the bit line BL7 at the other end is selected, the voltage of a bit line in a group adjacent to the selected bit line is hardly affected by the selection voltage VSA of the selected bit line BL4 or BL7. In this manner, in the second embodiment, both transistors connected to a bit line and transistors connected to a dummy bit line in a selected group are turned ON. Both transistors connected to a bit line and transistors connected to a dummy bit line in an unselected group are kept OFF.

Figure 6:
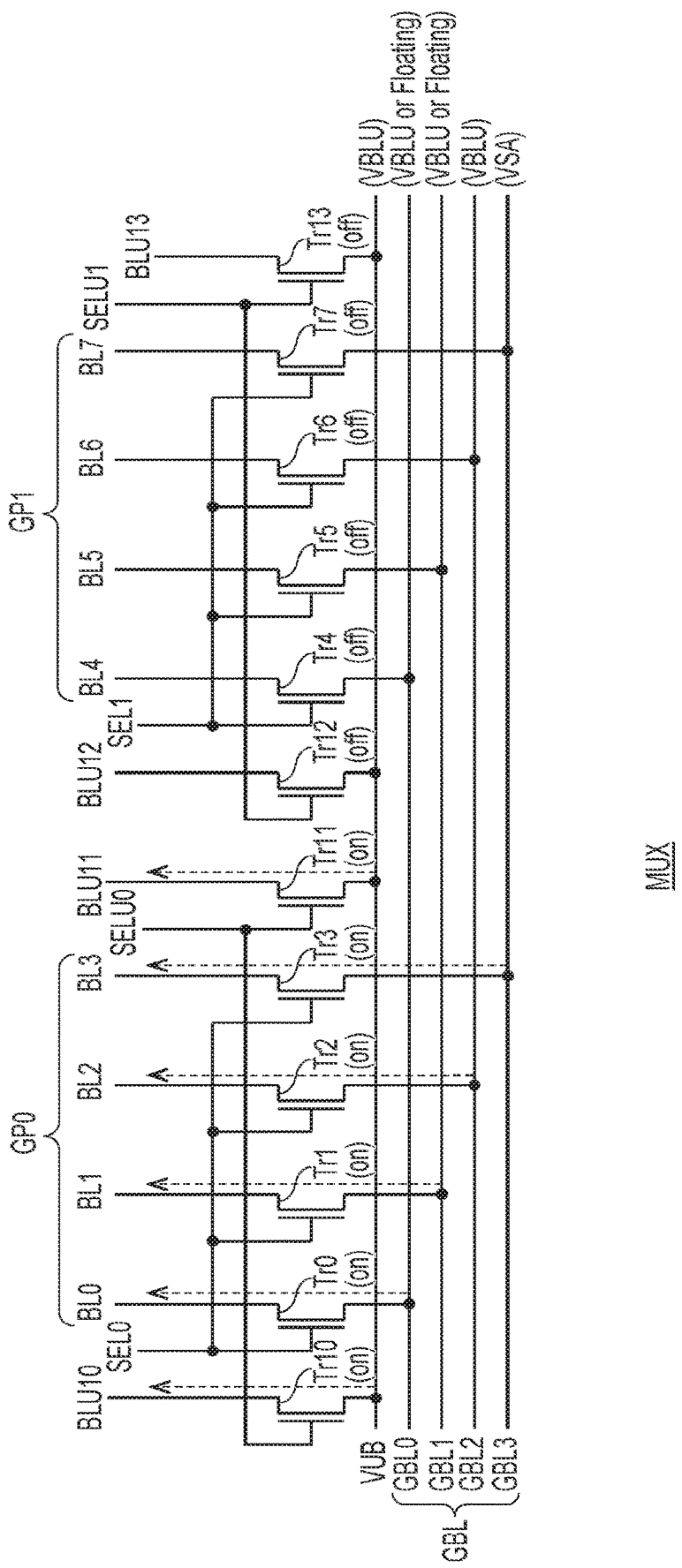
FIG. 6 is a diagram illustrating a state in a case of selecting the group.

FIG. 6 is a diagram illustrating a state in a case of selecting the group GP0. In a case where a selected group is GP0 and a selected bit line is BL3 as illustrated in FIG. 6, for example, the global bit lines GBL0 to GBL2 transmit the non-selection voltage VBLU and the global bit line GBL3 transmits the selection voltage VSA. The global bit lines GBL0 and GBL1 may be electrically floating. Moreover, the selection signal line SEL0 rises and the transistors Tr0 to Tr3 in the selected group GP0 are turned ON. Accordingly, the selection voltage VSA is transmitted to the selected bit line BL3 in the selected group GP0, and the non-selection voltage VBLU is transmitted to the other unselected bit lines BL0 to BL2 in the selected group GP0. The unselected bit lines BL0 and BL1 connected to the global bit lines GBL0 and GBL1 may be electrically floating. Meanwhile, because the transistors Tr4 to Tr7 in the unselected group GP1 are kept OFF, the bit lines BL4 to BL7 in the unselected group GP1 are electrically floating.

The dummy selection signal line SELU0 may be raised together with the selection signal line SEL0. Accordingly, the transistors Tr10 and Tr11 are turned ON together with (almost simultaneously with) the transistors Tr0 to Tr3, so that the dummy bit lines BLU10 and BLU11 on both sides of the selected group GP0 have the non-selection voltage VBLU. Meanwhile, the dummy selection signal line SELU1 is kept OFF and the dummy bit lines BLU12 and BLU13 in the unselected group GP1 are electrically floating, similarly to the bit lines BL4 to BL7. That is, when the group GP1 is unselected, the selection signal line SEL1 and the dummy selection signal line SELU1 that correspond to the unselected group GP1 are kept OFF.

The unselected bit line BL4 that is floating is not directly adjacent to the selected bit line BL3 but is arranged via the dummy bit line BLU11 having the non-selection voltage VBLU. Accordingly, capacity coupling between the bit lines BL3 and BL4 is suppressed, and the selection voltage VSA of the selected bit line BL3 does not affect the unselected bit line BL4 so much. As a result, although the unselected bit line BL4 is electrically floating, the voltage thereof does not fluctuate so much and becomes stable. Moreover, heat generated in the memory cells MC connected to the selected bit line BL3 hardly propagates to the memory cells MC connected to the unselected bit line BL4.

On the other hand, although not illustrated, in a case where the selected group is GP1 and the selected bit line is BL4, for example, the global bit lines GBL1 to GBL3 transmit the non-selection voltage VBLU and the global bit line GBL0 transmits the selection voltage VSA. In this case, the global bit lines GBL2 and GBL3 may be electrically floating. Moreover, the transistors Tr4 to Tr7 in the selected group GP1 are turned ON. Accordingly, the selection voltage VSA is transmitted to the selected bit line BL4 in the selected group GP1, and the non-selection voltage VBLU is transmitted to the other unselected bit lines BL5 to BL7 in the selected group GP1. The unselected bit lines BL6 and BL7 connected to the global bit lines GBL2 and GBL3 may be electrically floating. Meanwhile, because the transistors Tr0 to Tr3 in the unselected group GP0 are kept OFF, the bit lines BL0 to BL3 in the unselected group GP0 are electrically floating.

In this case, the dummy selection signal line SELU1 may be raised together with the selection signal line SEL1. Accordingly, the transistors Tr12 and Tr13 are turned ON together with (almost simultaneously with) the transistors Tr4 to Tr7, so that the dummy bit lines BLU12 and BLU13 on both sides of the selected group GP1 have the non-selection voltage VBLU. Meanwhile, the dummy selection signal line SELU0 is kept OFF, and the dummy bit lines BLU10 and BLU11 in the unselected group GP0 are electrically floating, similarly to the bit lines BL0 to BL3.

The unselected bit line BL3 that is floating is not directly adjacent to the selected bit line BL4 but is arranged via the dummy bit line BLU12 having the non-selection voltage VBLU. Accordingly, capacity coupling between the bit lines BL3 and BL4 is suppressed, and the selection voltage VSA of the selected bit line BL4 does not affect the unselected bit line BL3 so much. As a result, although the unselected bit line BL3 is electrically floating, the voltage thereof does not fluctuate so much and becomes stable. Moreover, heat generated in the memory cells MC connected to the selected bit line BL4 hardly propagates to the memory cells MC connected to the unselected bit line BL3.

Furthermore, in the second embodiment, only the transistors Tr10 and Tr11 corresponding to the selected group GP0 illustrated in FIG. 6 are turned ON to apply the non-selection voltage VBLU to a pair of the dummy bit lines BLU10 and BLU11, for example. The transistors Tr12 and Tr13 corresponding to the other unselected group GP1 are kept OFF and the non-selection voltage VBLU is not applied to a pair of the dummy bit lines BLU12 and BLU13. In this manner, it suffices to drive only dummy bit lines corresponding to a selected group in the second embodiment. Therefore, it is possible to reduce power consumption.

The configurations and the functions in the present embodiment can also be applied not only to the column decoder CD but also to the row decoder RD. That is, the configurations and the functions can be applied not only to "bit line" but also to "word line".

(Modification)

In the second embodiment, even when any bit line in a selected group is selected, the peripheral circuit PC applies the non-selection voltage VBLU to a dummy bit line in the selected group.

On the other hand, in the present modification, only when the bit line BL0 or BL3 at one end of the selected group GP0 illustrated in FIG. 6 is selected, for example, the peripheral circuit PC raises the dummy selection signal line SELU0 in the selected group GP0. In this case, when the bit line BL1 or BL2 in the middle of the selected group GP0 is selected, the peripheral circuit PC does not raise the dummy selection signal line SELU0.

When the bit line BL1 is selected, the non-selection voltage VBLU is applied to the unselected bit lines BL0 and BL2 adjacent to both sides of the selected bit line BL1. Moreover, when the bit line BL2 is selected, the non-selection voltage VBLU is applied to the unselected bit lines BL1 and BL3 adjacent to both sides of the selected bit line BL2. Therefore, when the bit line BL1 or BL2 in the middle of the selected group GP0 is selected, the non-selection voltage VBLU is applied to unselected bit lines on both sides of the selected bit line. Thus, in this case, the selection voltage VSA hardly affects the other unselected bit lines adjacent to the selected bit line, and it is unnecessary to raise the dummy selection signal line SELU0 in the selected group GP0.

Accordingly, only when the bit line BL0 or BL3 at one end of the selected group GP0 is selected, the dummy selection signal line SELU0 in the selected group GP0 is raised. When the bit line BL1 or BL2 in the middle of the selected group GP0 is selected, the dummy selection signal line SELU0 in the selected group GP0 is not raised. Therefore, it is possible to further reduce power consumption.

The number of the bit lines BL included in each group is usually a large number, for example, 64 or 128. Therefore, although the number of bit lines at both ends of each group is two, the number of bit lines in the middle of each group increases, for example, to 62 or 126 with increase of the number of the bit lines included in each group. In this case, it is considered that the frequency of selecting the bit lines at both ends of each group is relatively smaller than the frequency of selecting a bit line in the middle of each group. Accordingly, it is possible to largely reduce power consumption by raising a dummy selection signal line only when a bit line located at one end of a selected group is selected.

Third Embodiment

Figure 7:
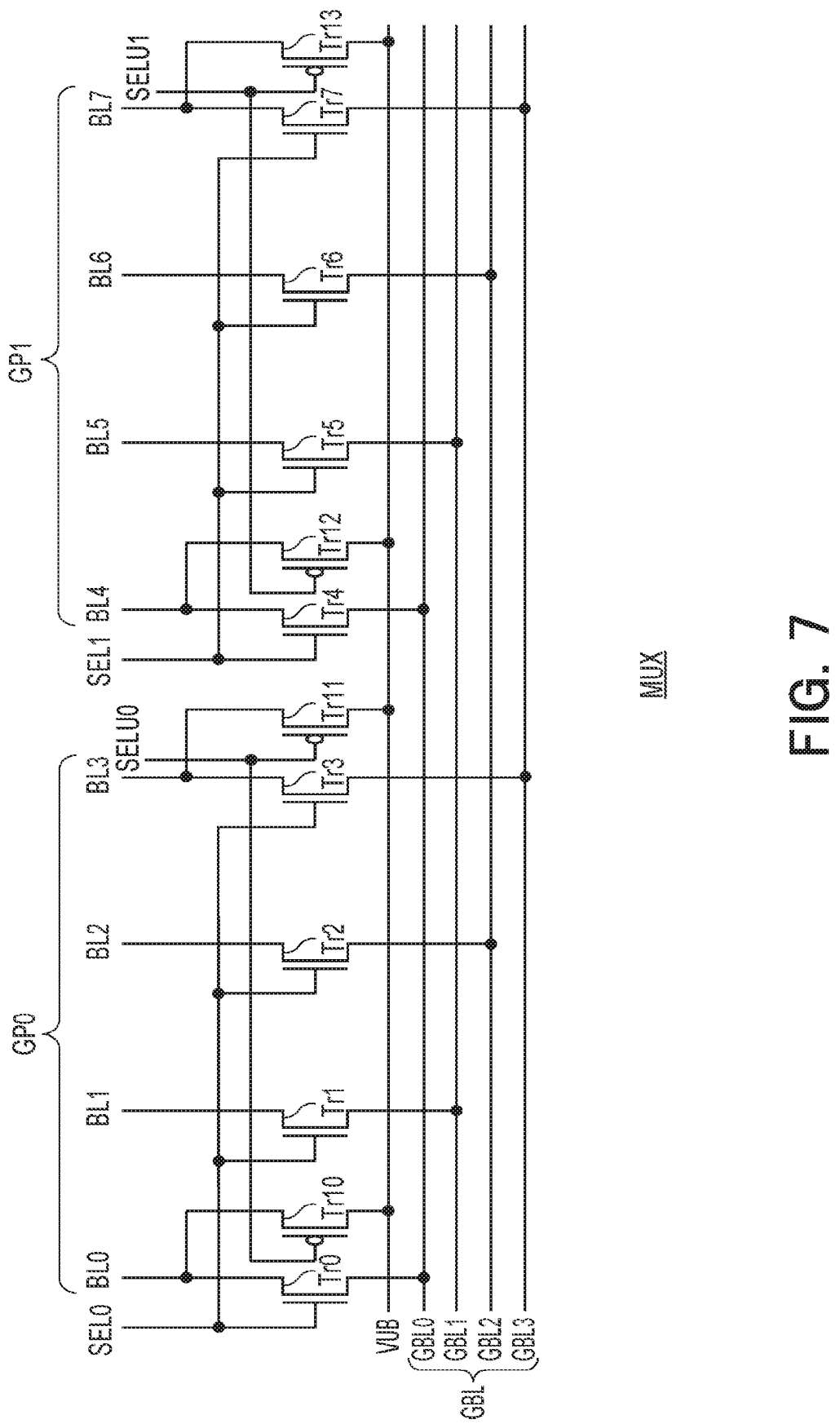
FIG. 7 is a circuit diagram illustrating a configuration example of the multiplexer in the column decoder according to a third embodiment.

FIG. 7 is a circuit diagram illustrating a configuration example of the multiplexer MUX in the column decoder CD according to a third embodiment. In the third embodiment, the transistors Tr10 to Tr13 as the second transistors are respectively connected between the bit lines BL0, BL3, BL4, and BL7 located at both ends of each of the groups GP0 and GP1 and the non-selection signal line VUB. That is, two transistors are connected to each of the bit lines BL0, BL3, BL4, and BL7 located at both ends of each of the groups GP0 and GP1, and one transistor is connected to each of the other middle bit lines BL1, BL2, BL5, and BL6. The dummy selection signal lines SELU0 and SELU1 as the second selection signal lines are provided to correspond to the groups GP0 and GP1, respectively. The dummy selection signal line SELU0 is connected to gate electrodes of the transistors Tr10 and Tr11 in common, and the dummy selection signal line SELU1 is connected to gate electrodes of the transistors Tr12 and Tr13 in common. In the third embodiment, no dummy bit line is provided. The transistors Tr10 to Tr13 are configured by p-MOSFETs, for example. Accordingly, the dummy selection signal lines SELU0 and SELU1 are activated by being caused to fall (low active) in the third embodiment. However, the transistors Tr10 to Tr13 may be configured by n-MOSFETs. Moreover, a device other than a transistor can be used as long as it has a switching function capable of switching connection. The rest of the configuration of the third embodiment may be identical to corresponding one of the second embodiment.

In the third embodiment, no dummy bit line is provided, and the bit lines BL0, BL3, BL4, and BL7 located at both ends of each of the groups GP0 and GP1 also function as dummy bit lines.

Each of the dummy selection signal lines SELU0 and SELU1 falls to be activated, when a group adjacent thereto is a selected group. For example, in a case where the group GP0 is a selected group, the dummy selection signal line SELU1 in the adjacent group GP1 adjacent to the selected group GP0 falls. Although not illustrated, a dummy selection signal line in a left adjacent group of the selected group GP0 also falls. Meanwhile, in a case where the group GP1 is the selected group, the dummy selection signal line SELU0 in the adjacent group GP0 adjacent to the selected group GP1 falls. Although not illustrated, a dummy selection signal line in a right adjacent group of the selected group GP1 also falls. The dummy selection signal line in the adjacent group may fall simultaneously with rising of a selection signal line in the selected group.

Figure 8:
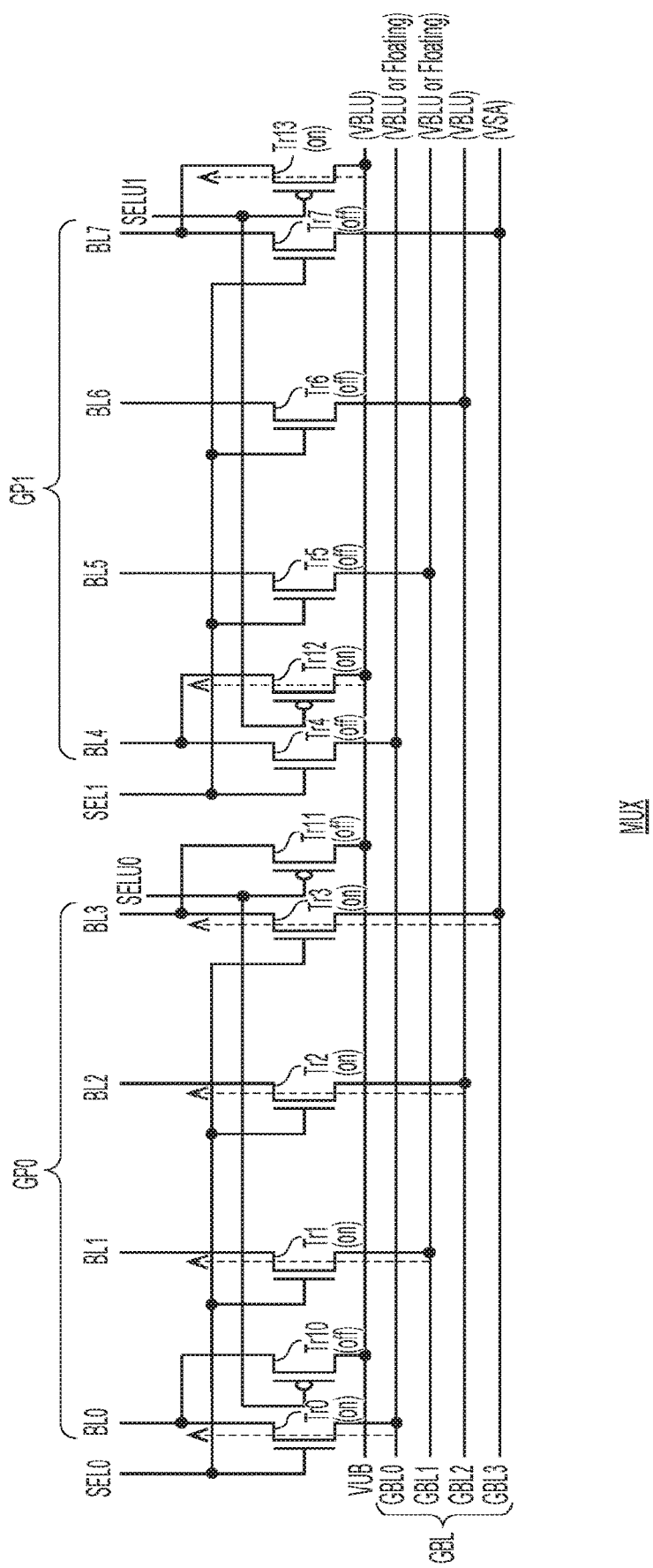
FIG. 8 is a diagram illustrating a state in a case of selecting the group GP0.

For example, FIG. 8 is a diagram illustrating a state in a case of selecting the group GP0. As illustrated in FIG. 8, in a case where the group GP0 is a selected group, the dummy selection signal line SELU1 in the adjacent group GP1 falls simultaneously with rising of the selection signal line SEL0 in the selected group GP0. Accordingly, the transistors Tr0 to Tr3 in the selected group GP0 are turned ON, and the transistors Tr12 and Tr13 in the adjacent group GP1 are also turned ON simultaneously. When the transistors Tr12 and Tr13 are turned ON, the bit lines BL4 and BL7 are connected to the non-selection signal line VUB to have the non-selection voltage VBLU. That is, the bit lines BL4 and BL7 located at both ends of the adjacent group GP1 have the non-selection voltage VBLU. Accordingly, even if the bit line BL3 at one end of the selected group GP0 is selected, the voltage of the bit line BL4 in the adjacent group GP1 is the non-selection voltage VBLU. Therefore, the bit line BL4 is hardly affected by the selection voltage VSA of the selected bit line BL3. In a case where the bit line BL0 at the other end of the selected group GP0 is selected, the voltage of a bit line at an end portion of a left adjacent group (not illustrated) becomes the non-selection voltage VBLU. Therefore, the bit line at the end portion of the adjacent group is also hardly affected by the selection voltage VSA of the selected bit line BL0. When the bit line BL3 is selected, the global bit line GBL2 connected to the adjacent bit line BL2 needs to have the non-selection voltage VBLU. However, the global bit lines GBL0 and GBL1 connected to the other unselected bit lines BL0 and BL1 may be floating.

Although not illustrated, on the other hand, in a case where the group GP1 is the selected group, the dummy selection signal line SELU0 in the adjacent group GP0 falls simultaneously with rising of the selection signal line SEL1 in the selected group GP1. Accordingly, the transistors Tr4 to Tr7 in the selected group GP1 are turned ON, and the transistors Tr10 and Tr11 in the adjacent group GP0 are also turned ON simultaneously. When the transistors Tr10 and Tr11 are turned ON, the bit lines BL0 and BL3 are connected to the non-selection signal line VUB to have the non-selection voltage VBLU. That is, the bit lines BL0 and BL3 located at both ends of the adjacent group GP0 have the non-selection voltage VBLU. Accordingly, even if the bit line BL4 at one end of the selected group GP1 is selected, the voltage of the bit line BL3 in the adjacent group GP0 is the non-selection voltage VBLU. Therefore, the bit line BL3 is hardly affected by the selection voltage VSA of the selected bit line BL4. When the bit line BL4 is selected, the global bit line GBL1 connected to the adjacent bit line BL5 needs to have the non-selection voltage VBLU. However, the global bit lines GBL2 and GBL3 connected to the other unselected bit lines BL6 and BL7 may be floating.

In a case where the bit line BL7 at the other end of the selected group GP1 is selected, the voltage of a bit line at an end portion of a right adjacent group (not illustrated) becomes the non-selection voltage VBLU. Therefore, the bit line at the end portion of the adjacent group is hardly affected by the selection voltage VSA of the selected bit line BL7.

In this manner, dummy bit lines may be omitted and the bit lines BL0, BL3, BL4, and BL7 at both ends of the groups GP0 and GP1 may have functions as dummy bit lines. With this configuration, it is necessary to provide the additional transistors Tr10 to Tr13 for the bit lines BL0, BL3, BL4, and BL7 at both ends of each of the group GP0 and GP1. However, because no dummy bit line is required, the arrangement area of the entire column decoder CD can be reduced. Moreover, the peripheral circuit PC in the third embodiment sets only bit lines located at end portions of adjacent groups adjacent to both sides of the selected group to have the non-selection voltage VBLU. Therefore, the third embodiment can reduce power consumption, similarly to the second embodiment.

The configurations and the functions in the present embodiment can also be applied not only to the column decoder CD but also to the row decoder RD. That is, the configurations and the functions can be applied not only to "bit line" but also to "word line".

(Modification)

In the third embodiment, even when any bit line in the selected group GP0 is selected, for example, the peripheral circuit PC causes the dummy selection signal line SELU1 in the adjacent group GP1 to fall.

On the other hand, in the present modification, only when the bit line BL0 or BL3 at one end of the selected group GP0 illustrated in FIG. 8 is selected, for example, the peripheral circuit PC causes the dummy selection signal line SELU1 in the adjacent group GP1 to fall. In this case, when the bit line BL1 or BL2 in the middle of the selected group GP0 is selected, the peripheral circuit PC does not cause the dummy selection signal line SELU1 to fall.

When the bit line BL1 is selected, the non-selection voltage VBLU is applied to the unselected bit lines BL0 and BL2 adjacent to both sides of the selected bit line BL1 via the transistors Tr0 and Tr2. Moreover, when the bit line BL2 is selected, the non-selection voltage VBLU is applied to the unselected bit lines BL1 and BL3 adjacent to both sides of the selected bit line BL2 via the transistors Tr1 and Tr3. Therefore, in a case where the bit line BL1 or BL2 in the middle of the selected group GP0 is selected, it is unnecessary to cause the dummy selection signal line SELU1 in the adjacent group GP1 to fall to activate it.

Accordingly, only when the bit line BL0 or BL3 at one end of the selected group GP0 is selected, the dummy selection signal line SELU1 in the adjacent group GP1 is caused to fall. When the bit line BL1 or BL2 in the middle of the selected group GP0 is selected, the dummy selection signal line SELU1 in the adjacent group GP1 is not caused to fall. Therefore, it is possible to further reduce power consumption.

As described above, the number of the bit lines BL included in each group is usually a large number, for example, 64 or 128. Accordingly, it is possible to largely reduce power consumption by, only when a bit line located at one end of a selected group is selected, causing a dummy selection signal line in an adjacent group to fall (activating it), as in the present modification.

Fourth Embodiment

Figure 9:
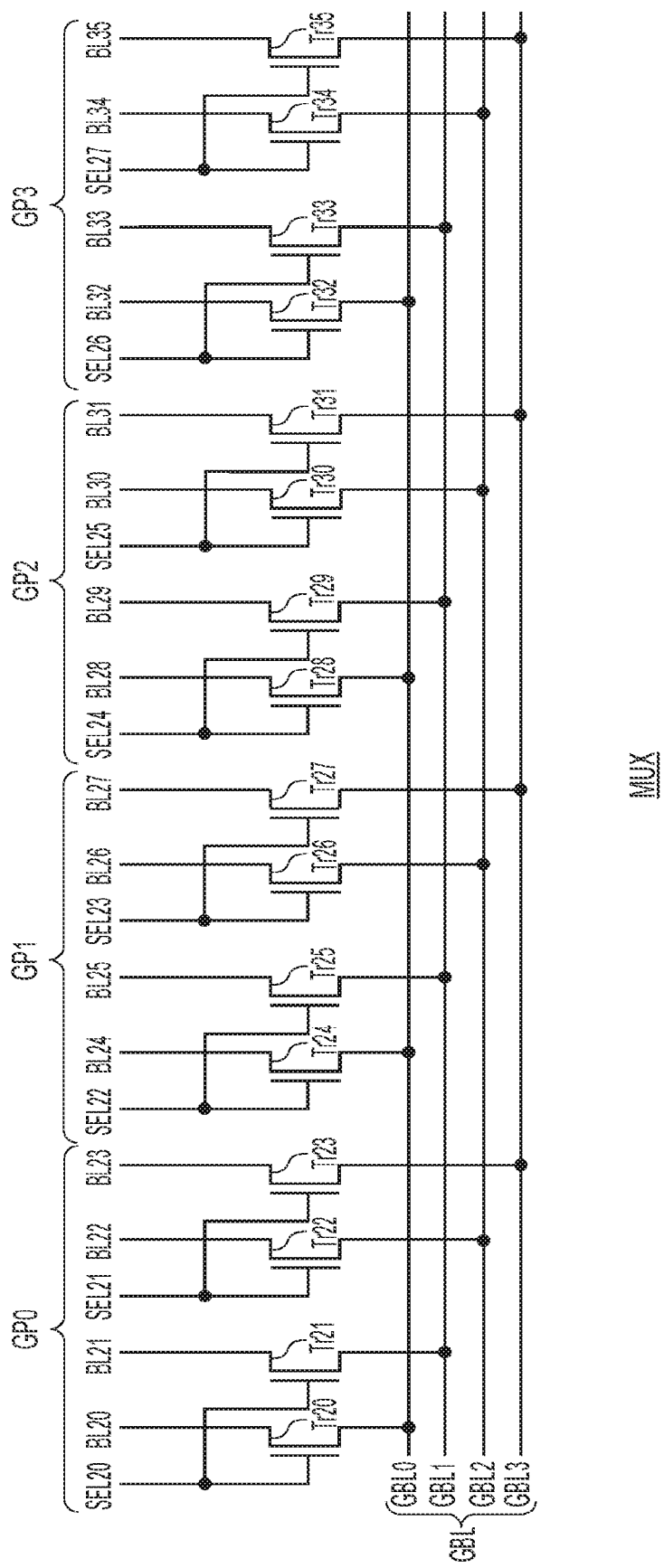
FIG. 9 is a circuit diagram illustrating a configuration example of the multiplexer in the column decoder according to a fourth embodiment.

FIG. 9 is a circuit diagram illustrating a configuration example of the multiplexer MUX in the column decoder CD according to a fourth embodiment. The fourth embodiment is identical to the third embodiment in that dummy bit lines are omitted and transistors Tr20 to Tr35 are provided to respectively correspond to bit lines BL20 to BL35.

Meanwhile, in the fourth embodiment, selection signal lines SEL20 to SEL27 are provided to each correspond to two transistors or two bit lines. For example, the selection signal line SEL20 is connected to gate electrodes of the transistors Tr20 and Tr21 in common. The selection signal line SEL21 is connected to gate electrodes of the transistors Tr22 and Tr23 in common. The selection signal line SEL22 is connected to gate electrodes of the transistors Tr24 and Tr25 in common. Similarly, the selection signal lines SEL23 to SEL27 are respectively connected to gate electrodes of the transistors Tr26 and Tr27, gate electrodes of the transistors Tr28 and Tr29, gate electrodes of the transistors Tr30 and Tr31, gate electrodes of the transistors Tr32 and Tr33, and gate electrodes of the transistors Tr34 and Tr35 in common.

In the first to third embodiments, four transistors in each group are simultaneously controlled by one selection signal line in common. Meanwhile, in the fourth embodiment, while the number of the bit lines BL included in each of groups GP0 to GP3 is four, the number of selection signal lines is two. That is, four transistors in each of the groups GP0 to GP3 are divided into two and are controlled by two selection signal lines. For example, the transistors Tr20 and Tr21 in the group GP0 are controlled by the selection signal line SEL20, and the transistors Tr22 and Tr23 are controlled by the selection signal line SEL21. In this manner, more flexible control can be executed by making a unit of controlling transistors within one group smaller (finer).

Figure 10:
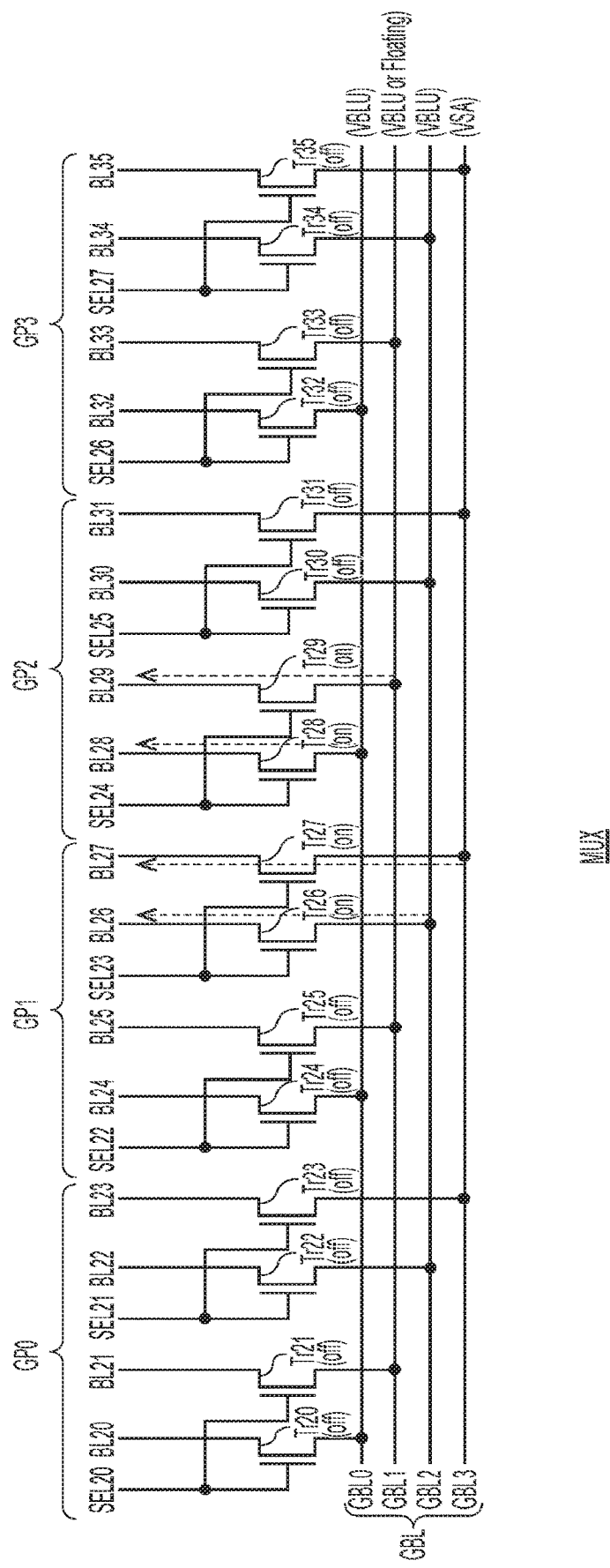
FIG. 10 is a diagram illustrating a state in a case of selecting the bit line BL27 in the group GP1.

For example, FIG. 10 is a diagram illustrating a state in a case of selecting the bit line BL27 in the group GP1. As illustrated in FIG. 10, in a case of selecting the bit line BL27 in the group GP1, the global bit lines GBL0 to GBL2 transmit the non-selection voltage VBLU and the global bit line GBL3 transmits the selection voltage VSA. The global bit line GBL1 may be electrically floating. Moreover, the selection signal lines SEL23 and SEL24 rise and the transistors Tr26 and Tr27 in the selected group GP1 and the transistors Tr28 and Tr29 in the unselected group GP2 are turned ON. Accordingly, the selection voltage VSA is transmitted to the selected bit line BL27 in the selected group GP1, and the non-selection voltage VBLU is transmitted to the unselected bit line BL26 in the selected group GP1 and the unselected bit lines BL28 and BL29 in the unselected group GP2. The unselected bit line BL29 connected to the global bit line GBL1 may be electrically floating. Because the other transistors Tr20 to Tr25 and Tr30 to Tr35 are kept OFF, the unselected bit lines BL20 to BL25 and BL30 to BL35 corresponding to those transistors are electrically floating.

In this case, the unselected bit lines BL26 and BL28 adjacent to both sides of the selected bit line BL27 have the non-selection voltage VBLU. Accordingly, the unselected bit lines BL26 and BL28 are not affected by the selection voltage VSA of the selected bit line BL27. Moreover, because the other unselected bit lines are not directly adjacent to the selected bit line BL27, they are hardly affected by the selection voltage VSA of the selected bit line BL27.

Although not illustrated, in a case of selecting the bit line BL26 in the group GP1, for example, the global bit lines GBL0, GBL1, and GBL3 transmit the non-selection voltage VBLU and the global bit line GBL2 transmits the selection voltage VSA. The global bit line GBL0 may be electrically floating. Moreover, the selection signal lines SEL22 and SEL23 rise and the transistors Tr24 to Tr27 in the selected group GP1 are turned ON. Accordingly, the selection voltage VSA is transmitted to the selected bit line BL26 in the selected group GP1, and the non-selection voltage VBLU is transmitted to the unselected bit lines BL24, BL25, and BL27 in the selected group GP1. The unselected bit line BL24 connected to the global bit line GBL0 may be electrically floating. Because the other transistors Tr20 to Tr23 and Tr28 to Tr35 are kept OFF, the unselected bit lines BL20 to BL23 and BL28 to BL35 corresponding to those transistors are electrically floating.

In this case, the unselected bit lines BL25 and BL27 adjacent to both sides of the selected bit line BL26 have the non-selection voltage VBLU. Accordingly, the unselected bit lines BL25 and BL27 are not affected by the selection voltage VSA of the selected bit line BL26. Moreover, because the other unselected bit lines are not directly adjacent to the selected bit line BL26, the other unselected bit lines are hardly affected by the selection voltage VSA of the selected bit line BL26.

Assuming that the number of the bit lines BL included in one group is m (m is an integer equal to or larger than 2) and the number of global bit lines is j, the number j of the global bit lines is an integer equal to or larger than m. Moreover, assuming that the number of selection signal lines corresponding to one group is k, k is an integer equal to or larger than 1. Therefore, Expression 1 is realized.

$$m \leq j \times k \quad \text{(Expression 1)}$$

In addition, the number k of the selection signal lines in one group does not exceed the number m of the bit lines in one group, and therefore Expression 2 is realized.

$$m \geq k \quad \text{(Expression 2)}$$

When Expression 1 and Expression 2 are combined, Expression 3 is obtained.

$$k \leq m \leq j \times k \quad \text{(Expression 3)}$$

It suffices to set j, k, and m to satisfy Expression 3.

In the first to third embodiments, m=j and k=1 are realized. In the fourth embodiment, m=j and k=2 are realized. When the number k of the selection signal lines in one group is increased, a unit of controlling the bit lines BL in one group becomes smaller. Therefore, in the fourth embodiment, even if the unit of controlling the bit lines BL becomes smaller than each unit in the first to third embodiments and dummy bit lines and additional transistors are not provided, it is possible to set an unselected bit line adjacent to a selected bit line to have the non-selection voltage VBLU.

Furthermore, by dividing the unit of controlling the bit lines BL20 to BL27 to a smaller unit, it is possible to avoid driving of another unselected bit line not adjacent to the selected bit line to have the non-selection voltage VBLU. For example, in a case of selecting the bit line BL27 in FIG. 10, it is unnecessary to drive the unselected bit lines BL20 to BL25 and BL30 to BL35 to have the non-selection voltage VBLU, and those unselected bit lines may remain electrically floating. Accordingly, power consumption can be reduced as compared with a case where the unit of controlling the bit lines BL is large. Moreover, the other unselected bit line not adjacent to the selected bit line may be driven to have the non-selection voltage VBLU in order to optimize the area of a decoder part.

The configurations and the functions in the present embodiment can also be applied not only to the column decoder CD but also to the row decoder RD. That is, the configurations and the functions can be applied not only to "bit line" but also to "word line".

(Modification)

Figure 11:
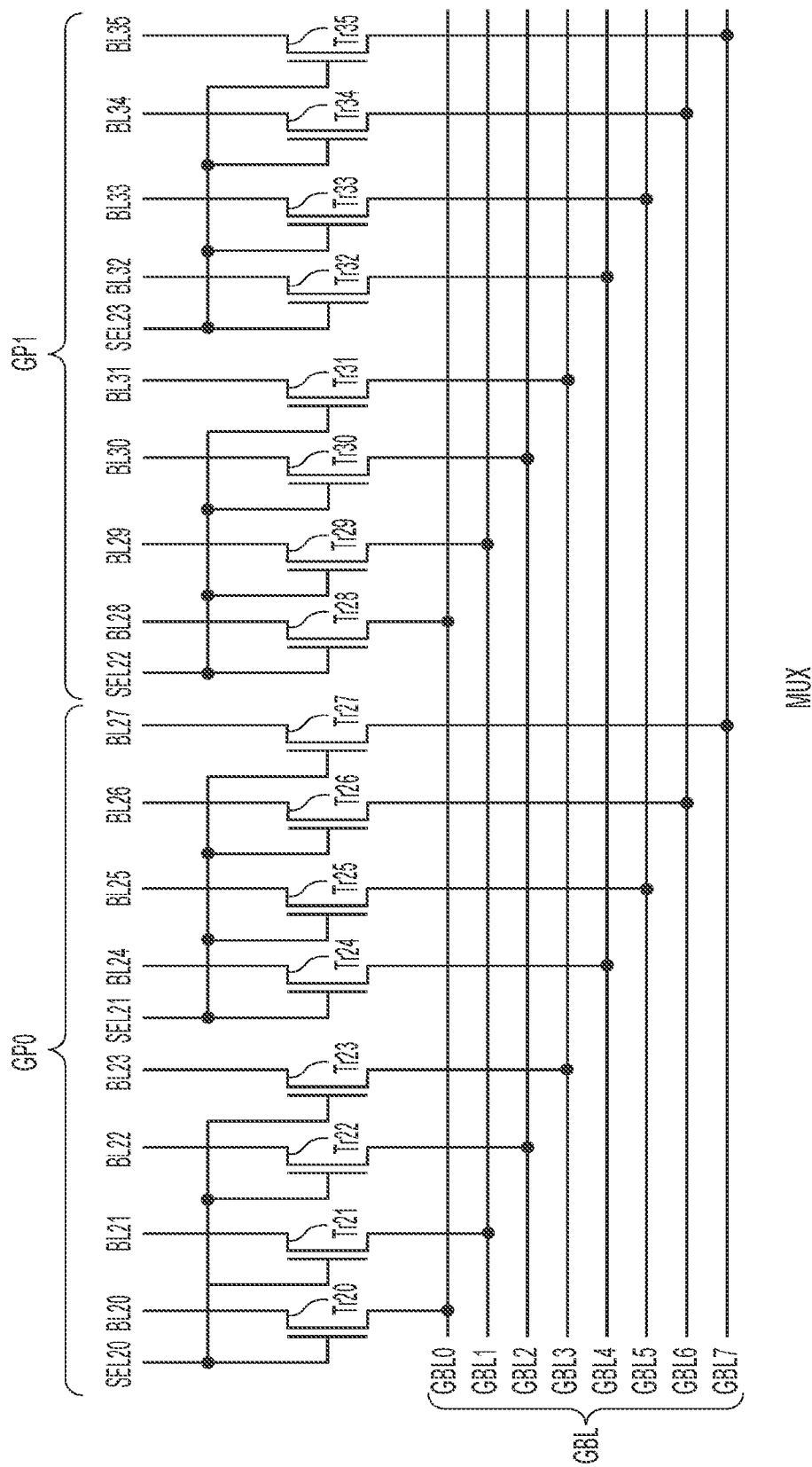
FIG. 11 is a circuit diagram illustrating a configuration example of the multiplexer in the column decoder according to a modification of the fourth embodiment.

FIG. 11 is a circuit diagram illustrating a configuration example of the multiplexer MUX in the column decoder CD according to a modification of the fourth embodiment. The present modification is identical to the fourth embodiment in that dummy bit lines are omitted and the transistors Tr20 to Tr35 are provided to respectively correspond to the bit lines BL20 to BL35. Moreover, the present modification is identical to the fourth embodiment also in that Expression 3 described above is realized. However, the number j (j=m) of global bit lines is 8 and, as a result, the number m of the bit lines BL included in one group is also 8. The number k of selection signal lines corresponding to one group is 2. The number of bit lines controlled by each of the selection signal lines SEL20 to SEL23 is 4. That is, a unit of controlling the bit lines BL20 to BL35 is 4. Therefore, although the unit of controlling the bit lines BL20 to BL35 in the present modification, m and j are different from those in the fourth embodiment, the present modification is identical to the fourth embodiment in that Expression 3 is satisfied. Because the unit of controlling the bit lines BL20 to BL35 is 4 and is larger than that in the fourth embodiment, the effect of reducing power consumption in the present modification is smaller than that in the fourth embodiment.

Figure 12:
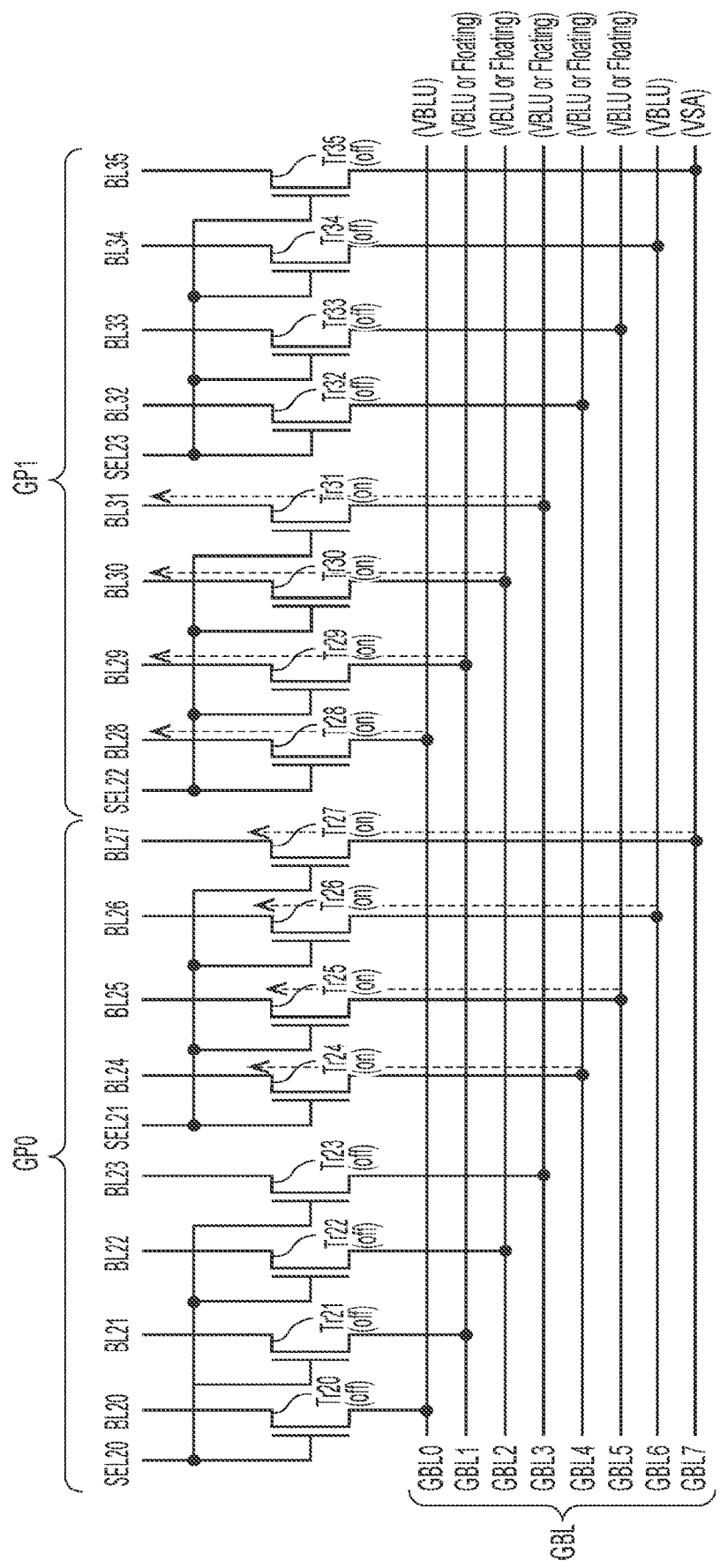
FIG. 12 is a diagram illustrating a state in a case of selecting the bit line BL27 in the group GP0.

For example, FIG. 12 is a diagram illustrating a state in a case of selecting the bit line BL27 in the group GP0. As illustrated in FIG. 12, in a case of selecting the bit line BL27 in the group GP0, global bit lines GBL0 to GBL6 transmit the non-selection voltage VBLU and a global bit line GBL7 transmits the selection voltage VSA. The global bit lines GBL1 to GBL5 may be electrically floating. Moreover, the selection signal lines SEL21 and SEL22 rise, and the transistors Tr24 to Tr27 in the selected group GP0 and the transistors Tr28 to Tr31 in the unselected group GP1 are turned ON. Accordingly, the selection voltage VSA is transmitted to the selected bit line BL27 in the selected group GP0, and the non-selection voltage VBLU is transmitted to the unselected bit lines BL24 to BL26 in the selected group GP0 and the unselected bit lines BL28 to BL31 in the unselected group GP1. The unselected bit lines BL24, BL25, and BL29 to BL31 connected to the global bit lines GBL1 to GBL5 may be electrically floating. Because the other transistors Tr20 to Tr23 and Tr32 to Tr35 are kept OFF, the unselected bit lines BL20 to BL23 and BL32 to BL35 corresponding to those transistors are electrically floating.

In this case, the unselected bit lines BL26 and BL28 adjacent to both sides of the selected bit line BL27 have the non-selection voltage VBLU. Accordingly, the unselected bit lines BL26 and BL28 are not affected by the selection voltage VSA of the selected bit line BL27. Moreover, because the other unselected bit lines are not directly adjacent to the selected bit line BL27, they are hardly affected by the selection voltage VSA of the selected bit line BL27.

(MUX for Global Bit Lines)

Figure 13:
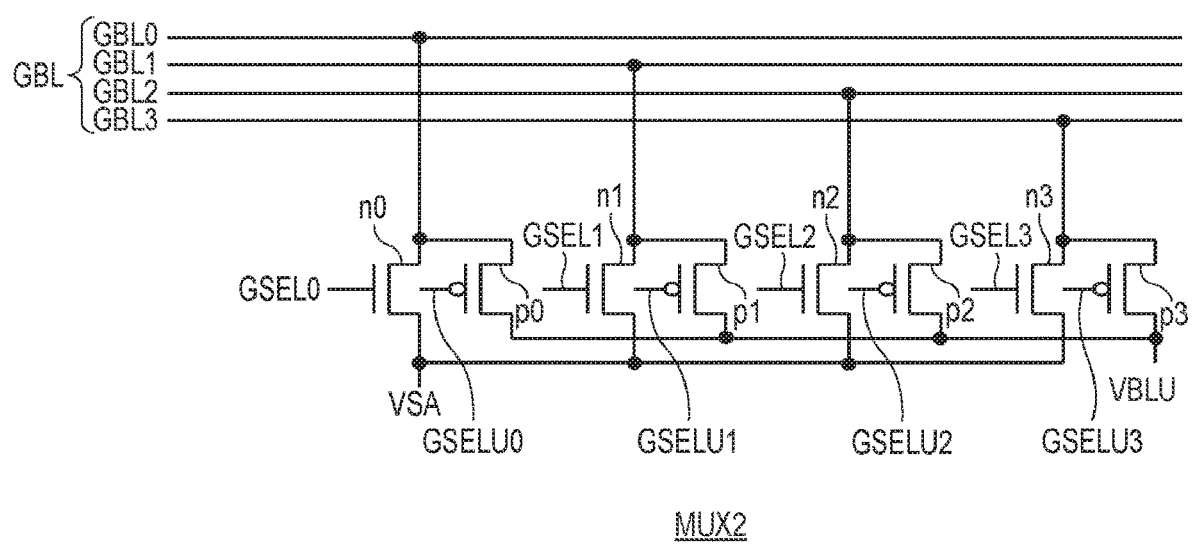
FIG. 13 is a circuit diagram illustrating a configuration example of a multiplexer between the global bit lines and the sense amplifier or the non-selection voltage generator.

FIG. 13 is a circuit diagram illustrating a configuration example of a multiplexer MUX2 between the global bit lines GBL0 to GBL3 and the sense amplifier SA or the non-selection voltage generator VBLUGEN. The multiplexer MUX2 is a circuit that sets the voltages of the global bit lines GBL0 to GBL3. The multiplexer MUX2 applies the selection voltage VSA to any one of the global bit lines GBL0 to GBL3 and applies the non-selection voltage VBLU to the other three global bit lines or sets them to be in an electrically floating state.

The multiplexer MUX2 includes n-MOSFETs N0 to N3 (hereinafter, transistors N0 to N3) and p-MOSFETs P0 to P3 (hereinafter, transistors P0 to P3). The transistors N0 to N3 are connected to the sense amplifier SA in common and transmit the selection voltage VSA. The transistors P0 to P3 are connected to the non-selection voltage generator VBLUGEN in common and transmit the non-selection voltage VBLU. The transistors N0 to N3 may be configured by p-MOSFETs, and the transistors P0 to P3 may be configured by n-MOSFETs. Moreover, a device other than a transistor can be used as long as it has a switching function capable of switching connection.

Gate electrodes of the transistors N0 to N3 are respectively connected to voltage selection signal lines GSEL0 to GSEL3. Gate electrodes of the transistors P0 to P3 are respectively connected to voltage non-selection signal lines GSELU0 to GSELU3. The gate electrodes of the transistors N0 and P0 may be connected to the voltage selection signal line GSEL0 in common. The gate electrodes of the transistors N1 and P1 may be connected to the voltage selection signal line GSEL1 in common. The gate electrodes of the transistors N2 and P2 may be connected to the voltage selection signal line GSEL2 in common. The gate electrodes of the transistors N3 and P3 may be connected to the voltage selection signal line GSEL3 in common. At this time, the transistors N0 to N3 and the transistors P0 to P3 operate in a complementary manner and transmit either the selection voltage VSA or the non-selection voltage VBLU to the global bit lines GBL0 to GBL3. In a case of setting a global bit line in an electrically floating state, it suffices to turn OFF a transistor (any of the transistors P0 to P3) corresponding to that global bit line.

For example, in a case of transmitting the selection voltage VSA to the global bit line GBL3 and the non-selection voltage VBLU to the other global bit lines GBL0 to GBL2, the peripheral circuit PC raises the voltage selection signal line GSEL3 and causes the voltage non-selection signal lines GSELU0 to GSELU2 to fall. Accordingly, the transistor N3 transmits the selection voltage VSA to the global bit line GBL3, and the transistors P0 to P2 transmit the non-selection voltage VBLU to the global bit lines GBL0 to GBL2. In a case of setting the global bit lines GBL0 and GBL1 in an electrically floating state, it suffices to turn OFF the transistors P0 and P1.

In this manner, the multiplexer MUX2 can cause any of the global bit lines GBL0 to GBL3 to have the selection voltage VSA selectively.

Figure 14:
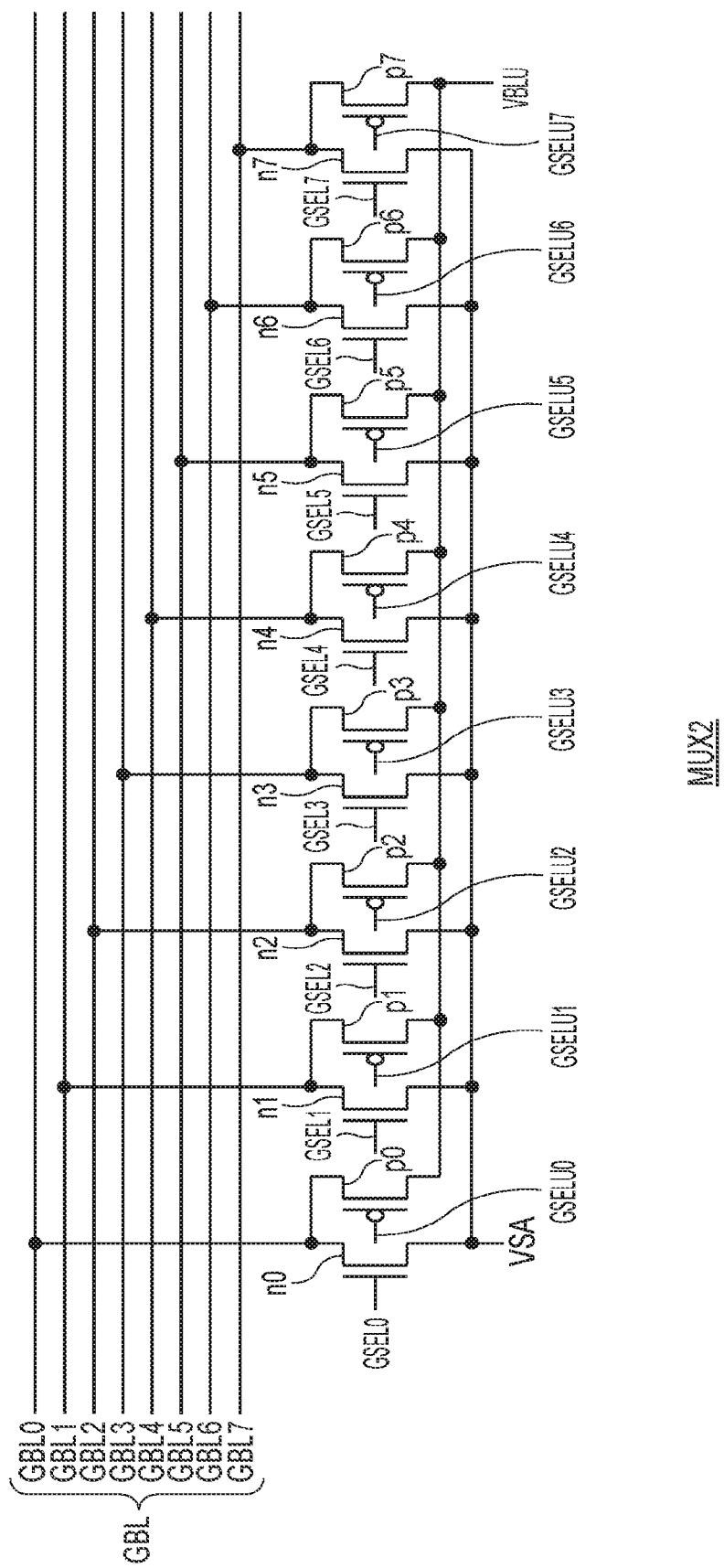
FIG. 14 is a circuit diagram illustrating another configuration example of the multiplexer between the global bit lines and the sense amplifier or the non-selection voltage generator.

FIG. 14 is a circuit diagram illustrating another configuration example of the multiplexer MUX2 between the global bit lines GBL0 to GBL7 and the sense amplifier SA or the non-selection voltage generator VBLUGEN. FIG. 14 illustrates a configuration example of the multiplexer MUX2 corresponding to the eight global bit lines GBL0 to GBL7.

The multiplexer MUX2 includes transistors N0 to N7 and transistors P0 to P7. Configurations of the transistors N0 to N7 and the transistors P0 to P7 may be identical to those illustrated in FIG. 13.

Gate electrodes of the transistors N0 to N7 are respectively connected to voltage selection signal lines GSEL0 to GSEL7. Gate electrodes of the transistors P0 to P7 are respectively connected to voltage non-selection signal lines GSELU0 to GSELU7. When the voltage selection signal lines GSEL0 to GSEL7 and the voltage non-selection signal lines GSELU0 to GSELU7 are connected, each of the transistors N0 to N7 and a corresponding one of the transistors P0 to P7 operate in a complementary manner and transmit either the selection voltage VSA or the non-selection voltage VBLU to a corresponding one of the global bit lines GBL0 to GBL7. In a case of setting a global bit line in an electrically floating state, it suffices to turn OFF a transistor (any of the transistors P0 to P7) corresponding to that global bit line.

For example, in a case of transmitting the selection voltage VSA to the global bit line GBL3 and the non-selection voltage VBLU to the other global bit lines GBL0 to GBL2 and GBL4 to GBL7, the peripheral circuit PC raises the voltage selection signal line GSEL3 and causes the voltage non-selection signal lines GSELU0 to GSELU2 and GSELU4 to GSELU7 to fall. Accordingly, the transistor N3 transmits the selection voltage VSA to the global bit line GBL3 and the transistors P0 to P2 and P4 to P7 transmit the non-selection voltage VBLU to the global bit lines GBL0 to GBL2 and GBL4 to GBL7. In a case of setting the global bit lines GBL0, GBL1, and GBL5 to GBL7 in an electrically floating state, it suffices to turn OFF the transistors P0, P1, and P5 to P7.

In this manner, the multiplexer MUX2 can cause any of the global bit lines GBL0 to GBL7 to have the selection voltage VSA selectively. The configuration of the multiplexer MUX2 is not limited thereto.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a plurality of first signal lines divided into a plurality of groups respectively including m (m is an integer equal to or larger than 2) of the first signal lines;
   a plurality of second signal lines;
   a memory cell array including a plurality of memory cells provided to correspond to respective intersections of the first signal lines and the second signal lines;
   m global signal lines, through which a selection voltage is applied to any of the first signal lines;
   a plurality of first transistors provided to respectively correspond to the first signal lines and connected between the first signal lines and the global signal lines;
   a plurality of first selection signal lines provided to respectively correspond to the groups and connected to gate electrodes of the first transistors included in a corresponding one of the groups in common; and
   a plurality of first dummy signal lines arranged between adjacent ones of the groups, to which a non-selection voltage is applied.

2. The device of claim 1, wherein the first selection signal lines turn ON the first transistors connected to the first signal lines in a selected group selected from the groups in order to electrically connect m of the first signal lines included in the selected group and the m global signal lines to each other, respectively.

3. The device of claim 1, wherein all the first dummy signal lines are kept to have a non-selection voltage.

4. The device of claim 1, further comprising:
   a non-selection signal line, through which the non-selection voltage is applied to the first dummy signal lines;
   a plurality of second transistors connected between the first dummy signal lines and the non-selection signal line; and
   a second selection signal line provided to correspond to one of the groups and connected to gate electrodes of the second transistors in the corresponding group in common.

5. The device of claim 4, wherein the first and second selection signal lines corresponding to one of the groups transmit a same signal.

6. The device of claim 4, wherein both the first and second transistors corresponding to a selected group selected from the groups are turned ON.

7. The device of claim 4, wherein, when the first signal line located at one end of a selected group selected from the groups is selected, the second transistors in the selected group are turned ON.

8. The device of claim 4, wherein the first and second selection signal lines corresponding to an unselected group of the groups are kept to have substantially the same voltage.

9. The device of claim 2, wherein a first signal line of the m first signal lines included in the selected group, which is not adjacent to a first signal line that applies the selection voltage, is electrically floating.

10. A semiconductor storage device comprising:
a plurality of first signal lines divided into a plurality of groups respectively including m (m is an integer equal to or larger than 2) of the first signal lines;
a plurality of second signal lines;
a memory cell array including a plurality of memory cells provided to correspond to respective intersections of the first signal lines and the second signal lines;
m global signal lines, through which a selection voltage is applied to any of the first signal lines;
a plurality of first transistors connected between the first signal lines and the global signal lines and provided to respectively correspond to the first signal lines;
a plurality of first selection signal lines provided to respectively correspond to the groups and connected to gate electrodes of the first transistors included in a corresponding one of the groups in common;
a non-selection signal line, through which a non-selection voltage is applied;
a plurality of second transistors connected between the first signal lines located at both ends of one of the groups and the non-selection signal line; and
a second selection signal line provided to correspond to one of the groups and connected to gate electrodes of the second transistors in the corresponding group in common.

11. The device of claim 10, wherein the first selection signal line in a selected group selected from the groups and the second selection signal line in an adjacent group adjacent to the selected group transmit a same signal.

12. The device of claim 10, wherein both the first transistors in a selected group selected from the groups and the second transistors in an adjacent group adjacent to the selected group are turned ON.

13. The device of claim 10, wherein the first signal lines located at both ends of an adjacent group adjacent to a selected group selected from the groups have the non-selection voltage.

14. The device of claim 10, wherein, only when the first signal line located at one end of a selected group selected from the groups is selected, the second transistors in an adjacent group adjacent to the selected group are turned ON.

15. The device of claim 10, wherein a first signal line of the m first signal lines included in the selected group, which is not adjacent to a first signal line that applies the selection voltage, is electrically floating.

16. A semiconductor storage device comprising:
a plurality of first signal lines divided into a plurality of groups respectively including m (m is an integer equal to or larger than 2) of the first signal lines;
a plurality of second signal lines;
a memory cell array including a plurality of memory cells provided to correspond to respective intersections of the first signal lines and the second signal lines;
m or more global signal lines, through which a selection voltage is applied to any of the first signal lines;
a plurality of first transistors connected between the first signal lines and the global signal lines and provided to respectively correspond to the first signal lines; and
a plurality of first selection signal lines provided to respectively correspond to the groups and connected to gate electrodes of the first transistors included in a corresponding one of the groups in common, wherein
when number of the global signal lines is j (j is an integer equal to or larger than m) and number of the first selection signal lines corresponding to one of the groups is k (k is a positive integer), $$m \leq j \times k \qquad \text{(Expression 1)}$$

Expression 1 is satisfied.

17. The device of claim 16, wherein $2 \times m = j \times k$ is satisfied.

18. The device of claim 16, wherein $k \leq m$ is satisfied.

19. The device of claim 16, wherein a first signal line of the m first signal lines included in a selected group selected from the groups, which is not adjacent to a first signal line that applies the selection voltage, is electrically floating.

* * * * *